United States Patent
Duan et al.

(10) Patent No.: US 11,421,345 B2
(45) Date of Patent: Aug. 23, 2022

(54) ULTRAFINE NANOWIRES AS HIGHLY EFFICIENT ELECTROCATALYSTS

(71) Applicant: THE REGENTS OF THE UNIVERSITY OF CALIFORNIA, Oakland, CA (US)

(72) Inventors: Xiangfeng Duan, Los Angeles, CA (US); Yu Huang, Los Angeles, CA (US); Mufan Li, Los Angeles, CA (US)

(73) Assignee: THE REGENTS OF UNIVERSITY OF CALIFORNIA, Oakland, CA (US)

( * ) Notice: Subject to any disclaimer, the term of this patent is extended or adjusted under 35 U.S.C. 154(b) by 351 days.

(21) Appl. No.: 16/329,084

(22) PCT Filed: Aug. 29, 2017

(86) PCT No.: PCT/US2017/049134
§ 371 (c)(1),
(2) Date: Feb. 27, 2019

(87) PCT Pub. No.: WO2018/044900
PCT Pub. Date: Mar. 8, 2018

(65) Prior Publication Data
US 2019/0226120 A1    Jul. 25, 2019

Related U.S. Application Data

(60) Provisional application No. 62/381,176, filed on Aug. 30, 2016.

(51) Int. Cl.
*C30B 33/10*    (2006.01)
*C30B 7/14*     (2006.01)
(Continued)

(52) U.S. Cl.
CPC .............. *C30B 33/10* (2013.01); *B22F 1/054* (2022.01); *B22F 1/16* (2022.01); *B22F 1/17* (2022.01);
(Continued)

(58) Field of Classification Search
CPC .... B01J 23/38; B01J 23/6482; B01J 23/6525; B01J 23/6527; B01J 23/686; B01J 23/688;
(Continued)

(56) References Cited

U.S. PATENT DOCUMENTS 9,840,789 B2 * 12/2017 Zhang ................... H01M 4/661
2006/0063062 A1 * 3/2006 Zhou .................... B01D 53/945
                                                              502/300
(Continued)

FOREIGN PATENT DOCUMENTS

KR    10-2015-0119815 A    10/2015
WO    WO-2015/038340 A1     3/2015

OTHER PUBLICATIONS

Jiao-Jiao Gao et al., "Dealloying monolithic Pt—Cu alloy to wire-like nanoporous structure for electrocatalysis and electrochemical sensing." Corrosion Science 108, pp. 194-199. (Year: 2016).*
(Continued)

*Primary Examiner* — Patricia L. Hailey
(74) *Attorney, Agent, or Firm* — Foley & Lardner LLP

(57) ABSTRACT

A manufacturing method includes: (1) providing M-M' nanowires, wherein M' is at least one sacrificial metal different from M; and (2) subjecting the M-M' nanowires to electrochemical de-alloying to form jagged M nanowires.

9 Claims, 13 Drawing Sheets

Pt@NiO core-shell NW

(51) Int. Cl.
| | |
|---|---|
| *C30B 29/52* | (2006.01) |
| *C25B 11/02* | (2021.01) |
| *C25F 1/00* | (2006.01) |
| *H01M 4/92* | (2006.01) |
| *B22F 9/24* | (2006.01) |
| *C30B 29/60* | (2006.01) |
| *C25F 7/00* | (2006.01) |
| *B22F 1/16* | (2022.01) |
| *B22F 1/17* | (2022.01) |
| *B22F 1/054* | (2022.01) |
| *B82Y 30/00* | (2011.01) |
| *B82Y 40/00* | (2011.01) |

(52) U.S. Cl.
CPC ............... *B22F 9/24* (2013.01); *C25B 11/02* (2013.01); *C25F 1/00* (2013.01); *C25F 7/00* (2013.01); *C30B 7/14* (2013.01); *C30B 29/52* (2013.01); *C30B 29/60* (2013.01); *H01M 4/926* (2013.01); *B22F 2998/10* (2013.01); *B82Y 30/00* (2013.01); *B82Y 40/00* (2013.01)

(58) Field of Classification Search
CPC . B01J 23/89; B22F 1/0018; B22F 1/02; B22F 1/025; B22F 2998/10; C25B 11/02; C25F 1/00; C25F 7/00; C30B 7/14; C30B 29/52; C30B 29/60; H01M 4/926; B82Y 30/00; B82Y 40/00
USPC ....... 502/308, 312, 313, 317, 326, 330, 338, 502/339; 977/762, 840, 888, 963
See application file for complete search history.

(56) References Cited

U.S. PATENT DOCUMENTS

| | | | |
|---|---|---|---|
| 2007/0099069 A1* | 5/2007 | Min ................... | H01M 4/92 429/483 |
| 2009/0098420 A1* | 4/2009 | Strasser ............. | H01M 4/921 429/483 |
| 2009/0114061 A1* | 5/2009 | Strasser ............. | H01M 4/90 75/255 |
| 2009/0256134 A1 | 10/2009 | Buchine et al. | |
| 2013/0034803 A1 | 2/2013 | Adzic et al. | |
| 2013/0150230 A1* | 6/2013 | Taylor ............... | H01L 31/0224 502/1 |
| 2014/0290436 A1* | 10/2014 | Wong ................ | B22F 9/24 75/344 |
| 2015/0045885 A1 | 2/2015 | Kiely et al. | |
| 2016/0126562 A1* | 5/2016 | Pivovar .............. | B82Y 40/00 502/326 |

OTHER PUBLICATIONS

Van Thi Thanh Ho et al., "Advanced nanoelectrocatalyst for methanol oxidation and oxygen reduction reaction, fabricated as one-dimensional pt nanowires on nanostructured robust Ti0.7Ru0.3O2 support." Nano Energy 1, pp. 687-695. (Year: 2012).*
Xinyi Zhang et al., "Porous platinum nanowire arrays for direct ethanol fuel cell applications." Chem. Commun., pp. 195-197. (Year: 2009).*
Yujiang Song et al., "Synthesis of Platinum Nanowire Networks Using a Soft Template." Nano Letters, vol. 7, No. 12, pp. 3650-3655. (Year: 2007).*
Chunyu Du et al., "Platinum-based intermetallic nanotubes with a core-shell structure as highly active and durable catalysts for fuel cell applications." Journal of Power Sources 240, pp. 630-635. (Year: 2013).*
Albert Serra et al., "Advanced electrochemical synthesis of multicomponent metallic nanorods and nanowires: Fundamentals and applications." Applied Materials Today 12, pp. 207-234. (Year: 2018).*
Xue Wang et al., "Dealloyed PtAuCu electrocatalyst to improve the activity and stability towards both oxygen reduction and methanol oxidation reactions." Electrochimica Acta 212, pp. 277-285. (Year: 2016).*
Peter Strasser et al., "Dealloyed Pt-based core-shell oxygen reduction electrocatalysts." Nano Energy 29, pp. 166-177. (Year: 2016).*
H.-J. Qiu et al., "Using corrosion to fabricate various nanoporous metal structures." Corrosion Science 92, pp. 16-31. (Year: 2014).*
Mufan Li et al., "Ultrafine jagged platinum nanowires enable ultrahigh mass activity for the oxygen reduction reaction." Science, vol. 354, Issue 6318, pp. 1414-1419. (Year: 2016).*
Alia, et al., "Galvanic Displacement as a Route to Highly Active and Durable, Extended Surface Electrocatalysts", Catalysis Science and Technology 4(10): 3589-3600 (2014).
Du, et al., "Pt-based nanowires as electrocatalysts in proton exchange fuel cells", Journal of Low-Carbon Technologies 7(1): 44-54 (2012).
Guo, et al., "Porous Nanostructured Metals for Electrocatalysis", Electroanalysis 24(11): 2035-2043 (2012).
International Search Report and Written Opinion, issued in International Application No. PCT/US2017/049134, 10 pages (dated Nov. 6, 2017).
Ruan, et al., "Biomimetic Synthesis of an Ultrathin Platinum Nanowire Network with a High Twin Density for Enhanced Electrocatalytic Activity and Durability", Electroanalysis 52(48): 12577-12581 (2013).

* cited by examiner

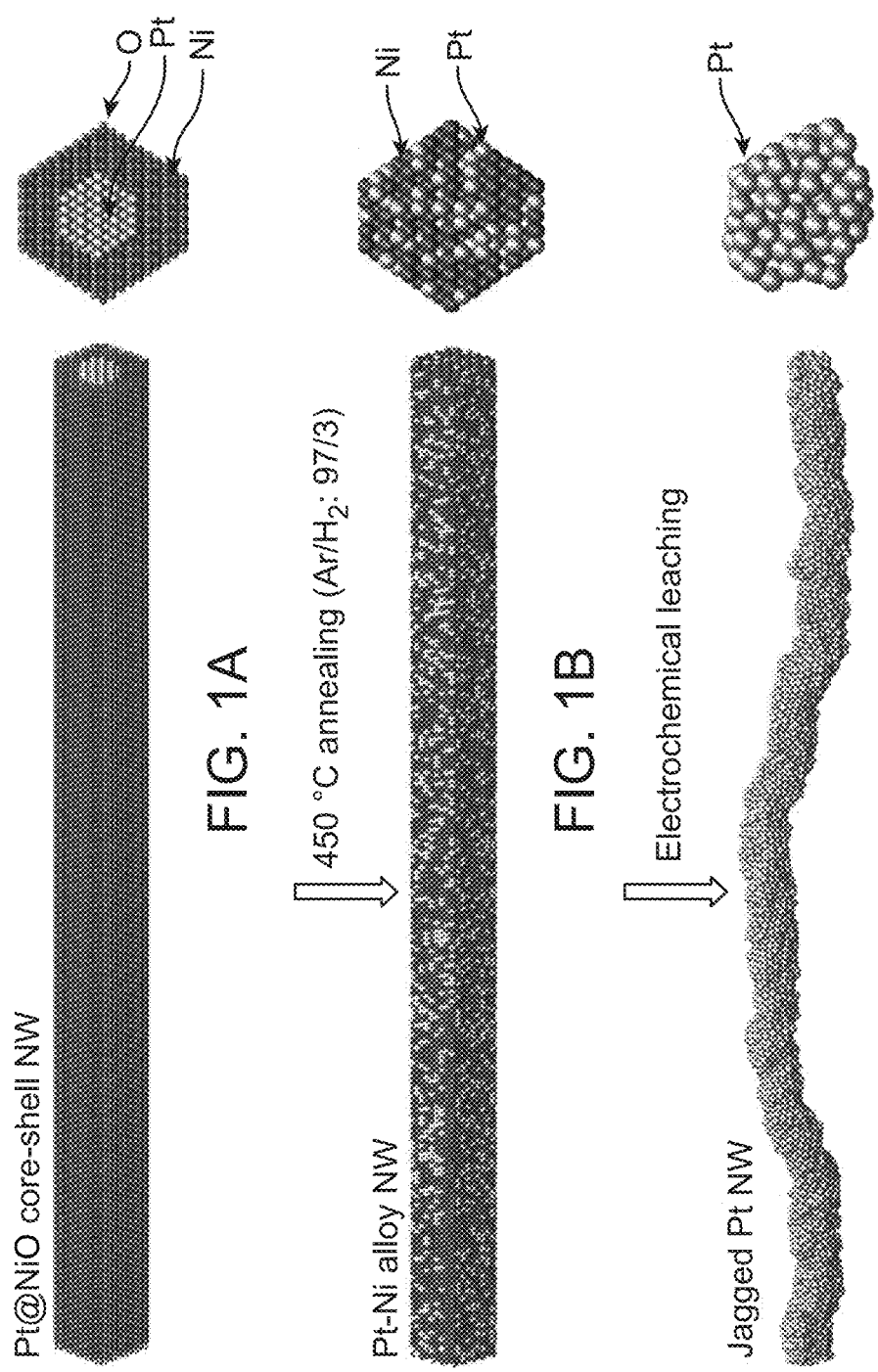

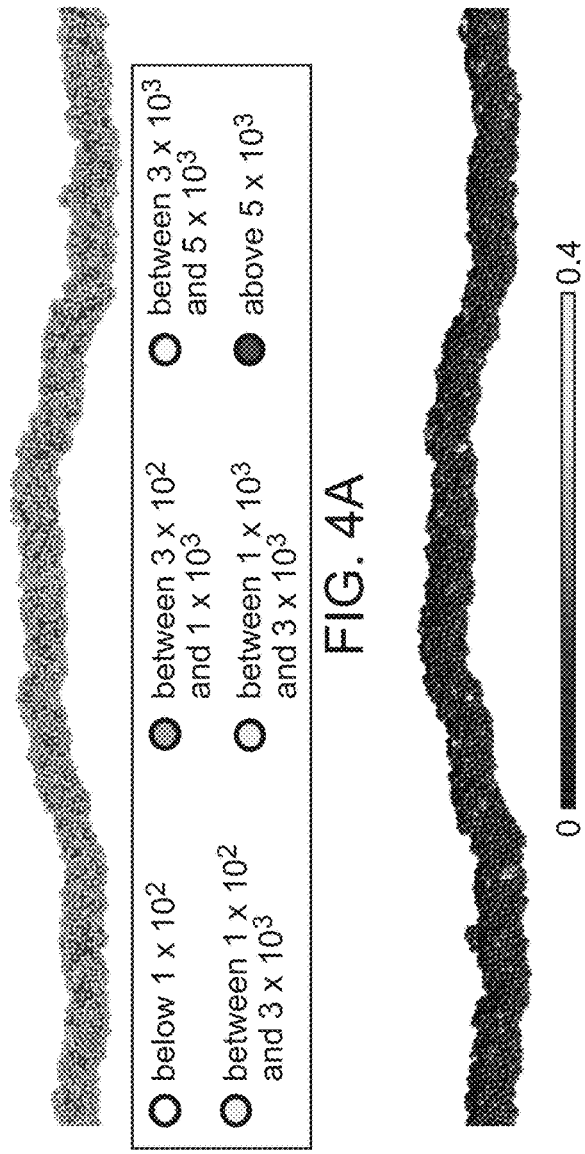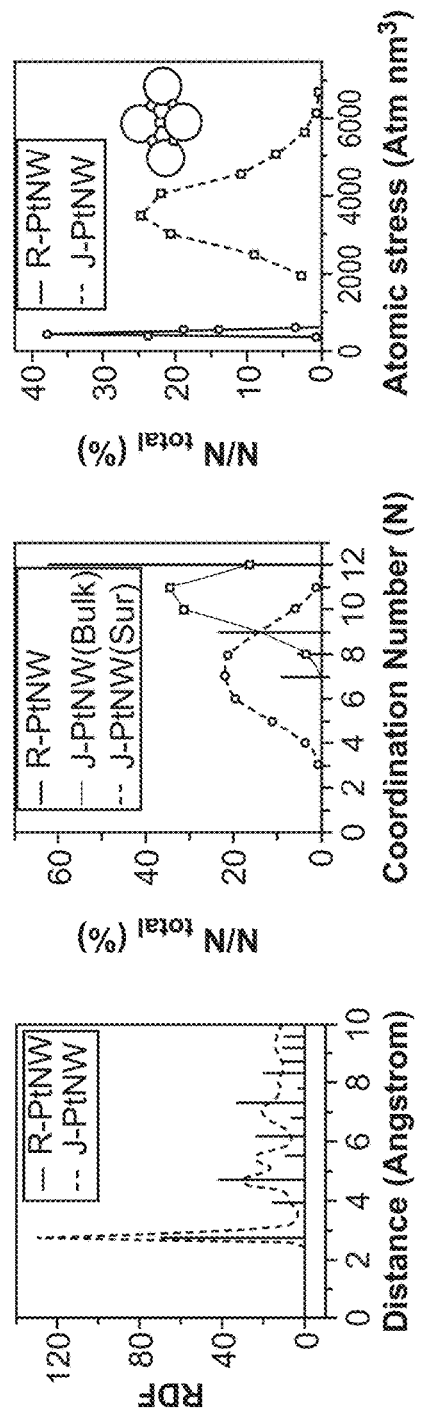
FIG. 4A
FIG. 4B
FIG. 4C
FIG. 4D
FIG. 4E

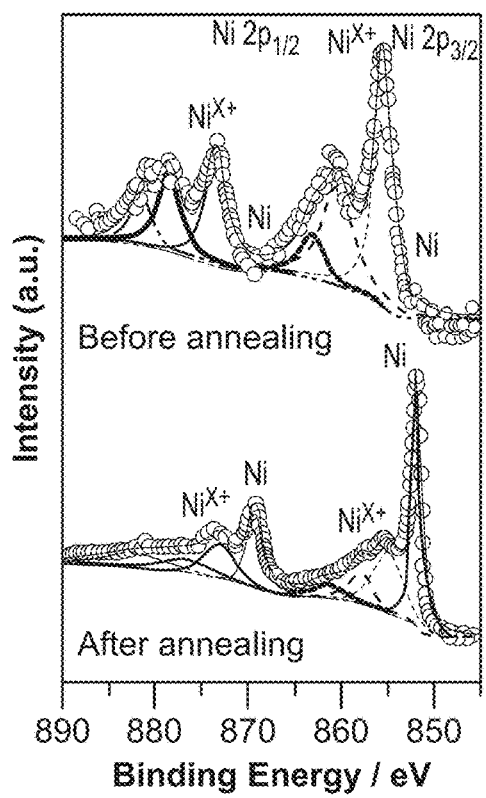
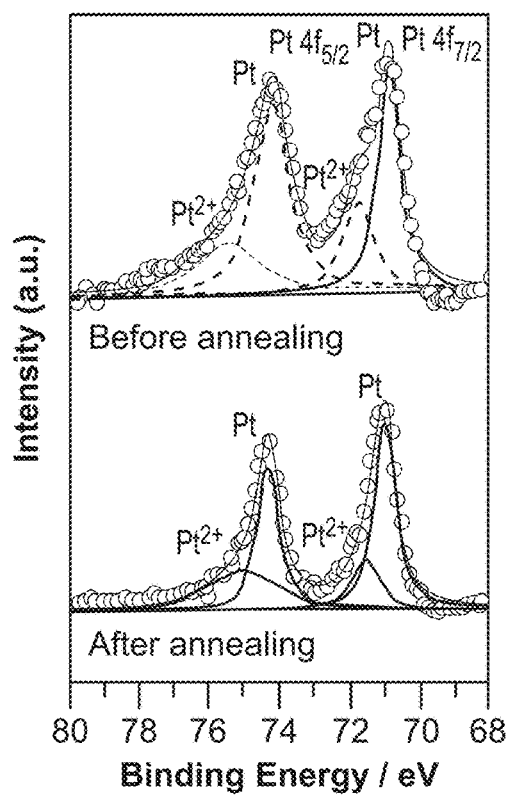
FIG. 10A          FIG. 10B
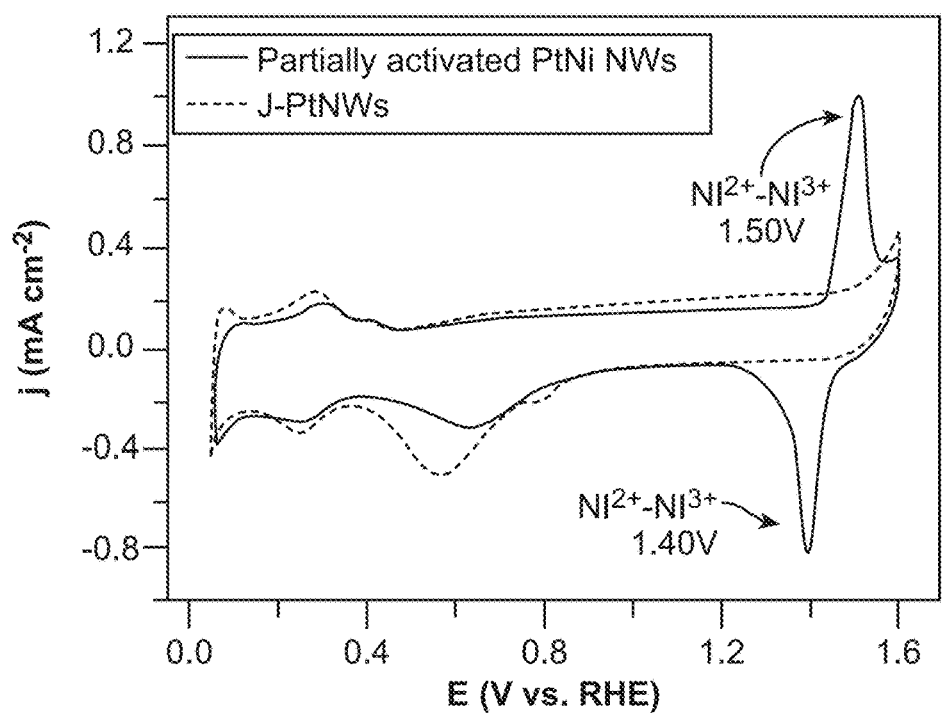
FIG. 11

ULTRAFINE NANOWIRES AS HIGHLY EFFICIENT ELECTROCATALYSTS

CROSS-REFERENCE TO RELATED APPLICATION

This application is a national stage of International Application No. PCT/US2017/049134, filed on Aug. 29, 2017, which claims the benefit of U.S. Provisional Application No. 62/381,176, filed on Aug. 30, 2016, the contents of which are incorporated herein by reference in their entireties.

TECHNICAL FIELD

This disclosure generally relates to electrocatalysts and, more particularly, to nanowires as electrocatalysts.

BACKGROUND

Fuel cells, with water as the sole or main by-product, are desired for harvesting green energy. In polymer electrolyte fuel cells, platinum (Pt) is widely used as a catalyst due to its relatively high activity for oxygen reduction reaction (ORR). However, the scarcity and skyrocketing price of Pt have impeded the widespread adoption of fuel cells. Hence, promoting Pt mass activity (the catalytic activity per given mass of Pt) is important for reducing the cost of fuel cells for commercial development. The Pt mass activity is fundamentally determined by a specific activity (SA, normalized by surface area) and an electrochemically active surface area (ECSA, normalized by mass). Considerable efforts have been devoted to optimizing the SA by tuning the chemical environment including chemical compositions, exposed surface facets, and Pt coordination environment. To date, improvement in SA has generally been achieved on single crystal surfaces or well-defined nanoparticles with specifically engineered facet structure and alloy compositions, typically with less than desired ECSA. For example, the $Pt_3Ni$ (111) single crystal facet and subsequently $Pt_3Ni$ octahedral nanoparticles have been reported to exhibit ORR-favorable surface structure for greatly enhanced activity, although such alloys typically suffer from insufficient stability due to electrochemical leaching of Ni atoms during electrochemical cycling. In parallel, improvement in ECSA has been proposed by tailoring geometrical factors including creating ultrafine nanostructures or core/shell nanostructures with an ultrathin Pt skin exposing most Pt atoms on the surface. However, these developments are typically conducted separately, making it rare that a high SA and a high ECSA are achieved simultaneously in the same catalyst system.

It is against this background that a need arose to develop the embodiments described herein.

SUMMARY

Improving the platinum (Pt) mass activity for oxygen reduction reaction (ORR) represents a challenge for fuel cell development. A high mass activity involves simultaneous optimization of the specific activity and the electrochemical active surface area. Herein, some embodiments are directed to the design and synthesis of ultrafine jagged Pt nanowires with a high ORR activity. In some embodiments, solution synthesized Pt/NiO core/shell nanowires can be readily converted into PtNi alloy nanowires through a post-synthesis thermal annealing process, and then transformed into jagged substantially pure Pt nanowires via an electrochemical de-alloying process. Electrochemical studies demonstrate that the jagged nanowires of some embodiments exhibit an electrochemical active surface area of about 118 $m^2/g_{Pt}$ and a specific activity of about 11.51 $mA/cm^2$ for ORR (at about 0.9 V vs. reversible hydrogen electrode (RHE)), together delivering a record high mass activity of about 13.59 $A/mg_{Pt}$, which nearly doubles the highest reported mass activity value. Reactive molecular dynamics simulations result in jagged nanowires closely resembling experimental structures, with comparable surface area and highly stressed, under-coordinated rhombi-rich surface configurations that favor enhanced ORR activity.

In some embodiments, a manufacturing method includes: (1) providing M-M' nanowires, wherein M' is at least one sacrificial metal different from M; and (2) subjecting the M-M' nanowires to electrochemical de-alloying to form jagged M nanowires.

In some embodiments of the manufacturing method, M is at least one noble metal selected from Pt, Ru, Pd, Ag, Rh, Os, Ir, and Au.

In some embodiments of the manufacturing method, M includes two different metals $M_1$ and $M_2$.

In some embodiments of the manufacturing method, M' is selected from Ni, Ti, V, Fe, Co, Cu, Ru, Pd, Ag, Mo, and W.

In some embodiments of the manufacturing method, M' is Ni.

In some embodiments of the manufacturing method, M' includes two different sacrificial metals $M'_1$ and $M'_2$.

In some embodiments of the manufacturing method, the M-M' nanowires include an alloy of M and M'.

In some embodiments of the manufacturing method, providing the M-M' nanowires includes: (1a) forming core/shell nanowires each including a core including M and a shell including an oxide of M'; and (1b) subjecting the core/shell nanowires to thermal annealing to form the M-M' nanowires.

In some embodiments of the manufacturing method, subjecting the M-M' nanowires to electrochemical de-alloying includes subjecting the M-M' nanowires to cyclic voltammetry in the presence of an acidic solution as an electrolyte to selectively remove M' from the M-M' nanowires.

In some embodiments, a catalyst material includes: (1) a catalyst support; and (2) jagged Pt nanowires affixed to the catalyst support.

In some embodiments of the catalyst material, the jagged Pt nanowires have an average diameter in a range of up to about 5 nm, up to about 3 nm, or up to about 2 nm.

In some embodiments of the catalyst material, the jagged Pt nanowires have an electrochemical active surface area of at least about 80 $m^2/g_{Pt}$, at least about 90 $m^2/g_{Pt}$, at least about 100 $m^2/g_{Pt}$, or at least about 110 $m^2/g_{Pt}$.

In some embodiments of the catalyst material, the jagged Pt nanowires have a mass activity for oxygen reduction reaction at 0.9 V vs. RHE of at least about 8 $A/mg_{Pt}$, at least about 10 $A/mg_{Pt}$, or at least about 12 $A/mg_{Pt}$.

In some embodiments, a method includes: (1) catalyzing oxygen reduction reaction or hydrogen evolution reaction using the above-mentioned catalyst material; (2) catalyzing oxygen evolution reaction using the above-mentioned catalyst material; (3) catalyzing $CO_2$ reduction using the above-mentioned catalyst material; (4) catalyzing CO oxidation using the above-mentioned catalyst material; (5) catalyzing $N_2$ reduction using the above-mentioned catalyst material; (6) catalyzing methanol oxidation reaction using the above-mentioned catalyst material; or (7) catalyzing ethanol oxidation reaction using the above-mentioned catalyst material.

In some embodiments, a manufacturing method includes: (1) providing M-M' nanostructures, wherein M' is at least one sacrificial metal different from M; and (2) subjecting the M-M' nanostructures to electrochemical de-alloying to form M nanostructures.

In some embodiments of the manufacturing method, M is at least one noble metal selected from Pt, Ru, Pd, Ag, Rh, Os, Ir, and Au.

In some embodiments of the manufacturing method, M includes two different metals $M_1$ and $M_2$.

In some embodiments of the manufacturing method, M' is selected from Ni, Ti, V, Fe, Co, Cu, Ru, Pd, Ag, Mo, and W.

In some embodiments of the manufacturing method, M' includes two different sacrificial metals $M'_1$ and $M'_2$.

In some embodiments of the manufacturing method, the M-M' nanostructures include an alloy of M and M'.

In some embodiments of the manufacturing method, providing the M-M' nanostructures includes: (1a) forming core/shell nanostructures each including a core including M and a shell including an oxide of M'; and (1b) subjecting the core/shell nanostructures to thermal annealing to form the M-M' nanostructures.

In some embodiments of the manufacturing method, subjecting the M-M' nanostructures to electrochemical de-alloying includes subjecting the M-M' nanostructures to cyclic voltammetry in the presence of an acidic solution as an electrolyte to selectively remove M' from the M-M' nanostructures.

In some embodiments of the manufacturing method, the M-M' nanostructures are M-M' nanoparticles, and the M nanostructures are M nanoparticles.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

FIG. 1. Schematic diagrams illustrating a process to obtain jagged Pt nanowires (J-PtNWs). (A) The Pt/NiO core/shell NWs are prepared using a solution chemistry approach. (B) The PtNi alloy NWs are generated by annealing the Pt/NiO core/shell NWs under Ar/$H_2$ (about 97/3) at about 450° C. (C) The J-PtNWs are generated via electrochemical leaching off Ni from the PtNi alloy NWs. The snapshot is from reactive molecular dynamics simulation. Side (left) and cross-section (right) views. Representative Pt, Ni and O are labeled.

FIG. 4. Structural analysis of a J-PtNW obtained from ReaxFF reactive molecular dynamics and their relation to high ORR performance. Using the ReaxFF reactive force field, reaction dynamics simulations of the de-alloying process are performed. Starting with the 5 nm diameter PtNi NW, Ni atoms are removed and the resulting Pt structure is optimized as shown in A and B, which has an average diameter of about 2.0 nm in agreement with experiment. (A) Each atom of the predicted J-PtNW is shaded to show distribution of atomic stress (in atm·nm$^3$). The magnitudes are distinguished by shading. (B) Each atom of the predicted J-PtNW is shaded to show the 5-fold index, namely the ratio of icosahedral fingerprint [5,5,5] triplets to the total number of triplets in Common Neighbor Analysis: the lower value of the 5-fold index indicates a less icosahedral-like coordination environment and a better crystallinity, which correlates with the increased activity. (C) Pt—Pt radial distribution function (RDF) of the predicted J-PtNW compared with the peaks of the RDF for the regular PtNW. (D) Coordination number for bulk atoms and surface atoms of the J-PtNWs, and atoms of R-PtNWs evaluated by counting all neighbors within a distance cut-off of 3.0 Å. (E) Distribution of the average atomic stress on surface rhombi for the R-PtNWs and the J-PtNWs. A rhombus is an ensemble of 4 atoms arranged as two equilateral triangles sharing one edge as shown in the inset.

FIG. 10. (A) Ni, and (B) Pt X-ray photoelectron spectroscopy (XPS) comparison before and after annealing of Pt/NiO core/shell nanowires/C.

FIG. 11. CV curves for partially activated Pt—Ni alloy NWs (150 cycles in about 0.1 M HClO$_4$ solution) and J-PtNWs in alkaline electrolyte with a scan rate of about 50 mVs$^{-1}$. The current densities were normalized to the geometric area of the RDE (about 0.196 cm$^2$).

DETAILED DESCRIPTION

To significantly boost Pt mass activity and utilization efficiency, a desirable catalyst should concurrently feature an ORR-favorable chemical environment for high SA, as well as optimized geometric factors for high ECSA. Indeed, some embodiments can achieve both goals in a substantially pure Pt catalyst to deliver a record high Pt mass activity. Here some embodiments are directed to the preparation of ultrafine jagged Pt nanowires (J-PtNWs) (diameter of about 2 nm) with rich ORR-favorable rhombic configurations to simultaneously ensure an ultrahigh SA of about 11.51 mA/cm$^2$ or more (at about 0.9 V vs. RHE) and an ultrahigh ECSA of about 118 m$^2$/g$_{Pt}$ or more. Together, these J-PtNWs deliver an ultrahigh mass activity of about 13.59 A/mg$_{Pt}$ or more (at about 0.9 V vs. RHE), which is about 52 times higher than state-of-the-art commercial Pt/C catalyst, and nearly doubles the highest reported mass activity value.

FIG. 1 schematically illustrates a process flow to prepare the J-PtNWs. In a typical synthesis, Pt/NiO core/shell NWs were first prepared by reducing platinum (II) acetylacetonate [Pt(acac)$_2$] and nickel(II) acetylacetonate [Ni(acac)$_2$] in a mixture solvent of 1-octadecene (ODE) and oleylamine (OAm) (synthesis details are available in the Example section) (FIG. 1A). The as-prepared Pt/NiO NWs were then loaded onto carbon black and annealed in an argon/hydrogen mixture (Ar/H$_2$: about 97/3) at about 450° C. to obtain PtNi alloy NWs (FIG. 1B). Finally, the PtNi alloy NWs were electrochemically de-alloyed to produce ultrafine substantially pure Pt NWs with jagged surfaces (FIG. 1C). It should be noted that the Ni in other PtNi alloy nanocatalysts has been generally considered to play an active role in modifying the electronic structure and/or chemical environment to enhance the ORR activity. However in the design herein, the Ni in the PtNi alloy NWs plays a sacrificial role, in which the Ni atoms are leached substantially entirely from the alloy NWs to form ultrafine substantially pure J-PtNWs with ORR favorable surface configurations to simultaneously achieve both the optimized SA and ECSA for record high mass activity.

Figure 2A:
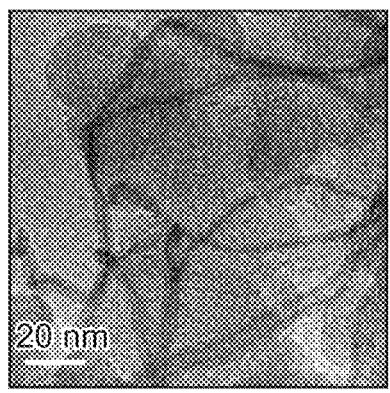
FIG. 2. Structure and composition characterization of different stages of the J-PtNW evolution process. (A, B and C) Representative transmission electron microscopy (TEM) images and (D, E and F) high-resolution TEM (HRTEM) images of the Pt/NiO core/shell NWs, the PtNi alloy NWs and the J-PtNWs supported on carbon, respectively. The inset in C shows a false-colored, zoomed-in image of the J-PtNWs, highlighting the rough surface (scale bar: 10 nm). The inset in F shows the corresponding Fast Fourier transform (FFT) image. The dashed lines in E and F show the outline of the NWs, highlighting the rough surface of the J-PtNWs. (G, H and I) Energy dispersive X-ray spectroscopy (EDS) line-scan profiles of the corresponding NWs show the evolution from the Pt/NiO core/shell, to PtNi alloy, and then substantially pure Pt NWs.
Figure 2B:
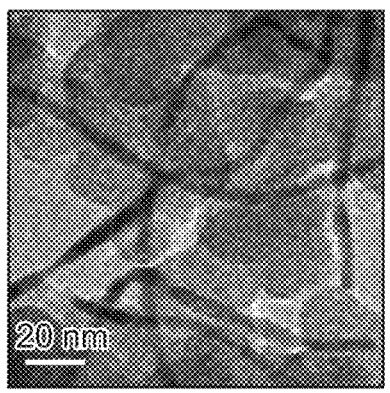
Figure 2C:
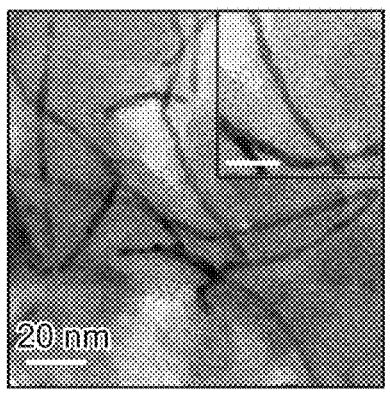
Figure 2D:
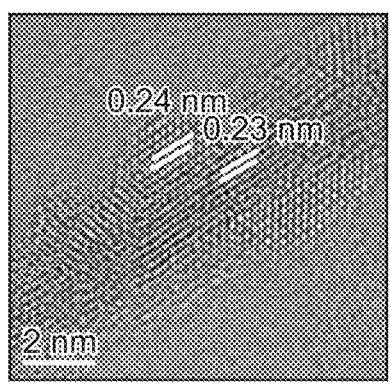
Figure 6A:
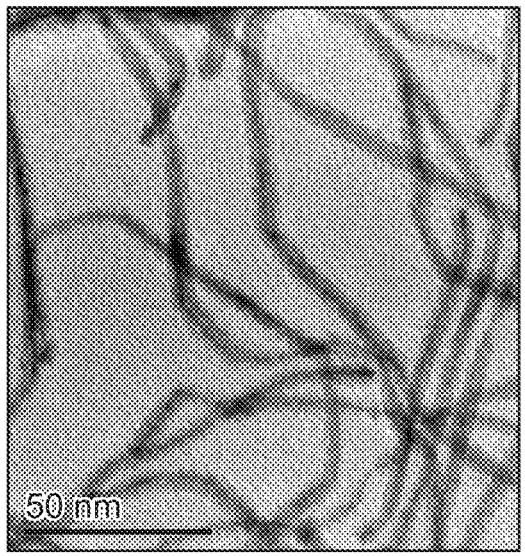
FIG. 6. (A and B) TEM images for Pt/NiO core/shell nanowires and regular nanowires. (C and D) Scanning transmission electron microscopy (STEM) images for Pt/NiO nanowires/C before and after annealing at about 450° C. in Ar/$H_2$ (about 97/3) atmosphere for about 12 hours.

Transmission electron microscopy (TEM) studies show that the as-synthesized NWs exhibit an apparent core/shell structure with a higher contrast core and a lower contrast shell. The NWs have a typical overall diameter of about 5 nm or less (e.g., about 4.5 nm), and a length of about 250-300 nm (FIG. 2A, FIG. 6A). High-resolution TEM (HRTEM) studies confirm the core/shell structure with a typical core diameter of 2.0 nm 0.2 nm (FIG. 2D). The shell shows resolved lattice fringes with a spacing of about 0.24 nm, corresponding to the (111) lattice planes of face-centered cubic (fcc) NiO (FIG. 2D), and the core displays a primary lattice spacing of about 0.23 nm, corresponding to Pt (111) planes (FIG. 2D). After annealing in a reducing atmosphere (Ar/H$_2$: about 97/3) at about 450° C., the overall morphology of the NW was maintained without noticeable change in length or diameter, while the apparent core/shell contrast disappeared (FIG. 2B), indicating the formation of substantially uniform PtNi alloy NWs.

Figure 7A:
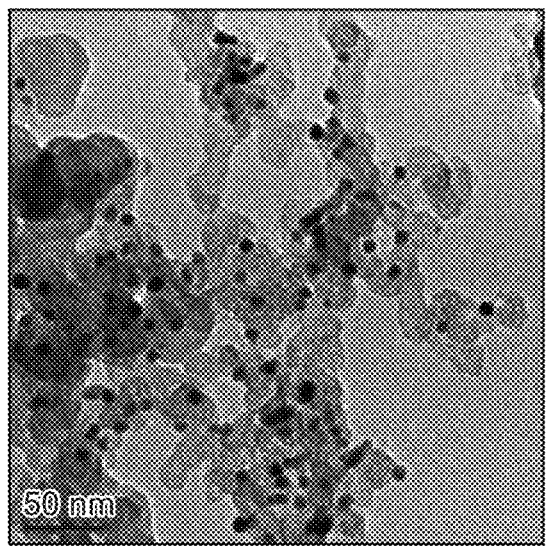
FIG. 7. TEM images of PtNi NPs (A) before and (B) after annealing at about 450° C. in Ar/$H_2$ (about 97/3) atmosphere for about 12 hours.
Figure 7B:
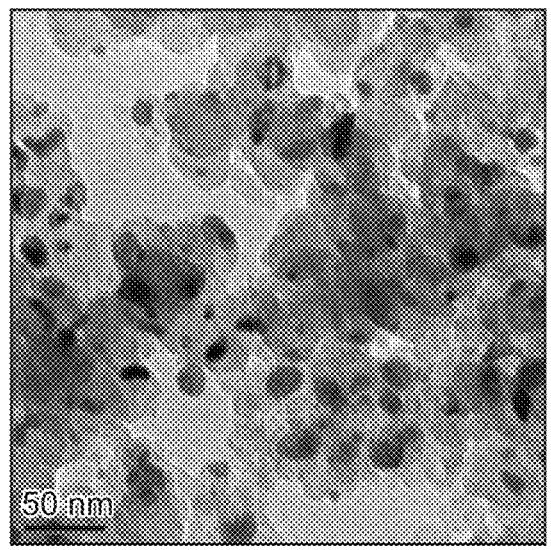

It should be noted that one-dimensional (1D) NW geometry (vs. 0D nanoparticle geometry) is desirable for ensuring the thermal stability of these ultrafine NWs under high temperature annealing. For example, a similar thermal annealing process applied to nanoparticles led to serious aggregation of the nanoparticles (FIG. 7), which can be partly attributed to the movement and fusion of nanoparticles during the annealing process. In contrast, NWs supported on carbon black have multiple anchoring points along the axial direction due to their 1D geometry. With multi-point contacts, the mobility of the 1D NWs on carbon support is much lower compared to 0D nanoparticles on carbon support with single point contact, and therefore are more stable during the thermal annealing process.

Figure 2E:
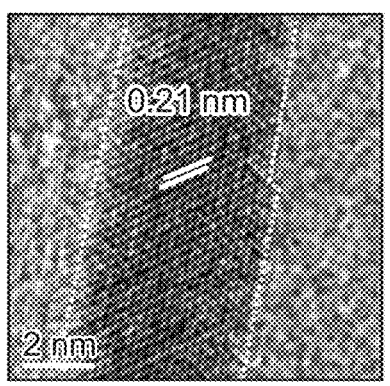
Figure 6B:
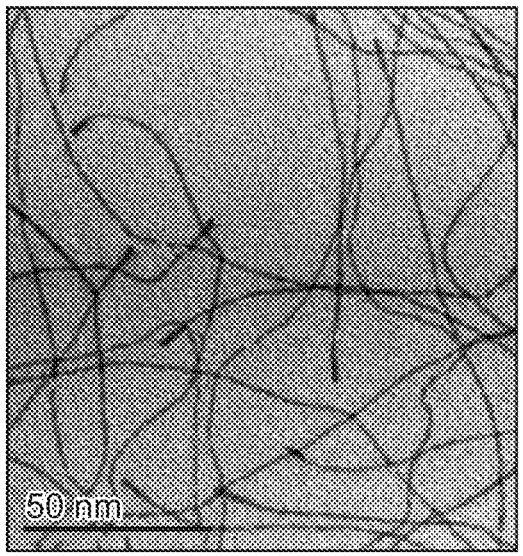
Figure 6C:
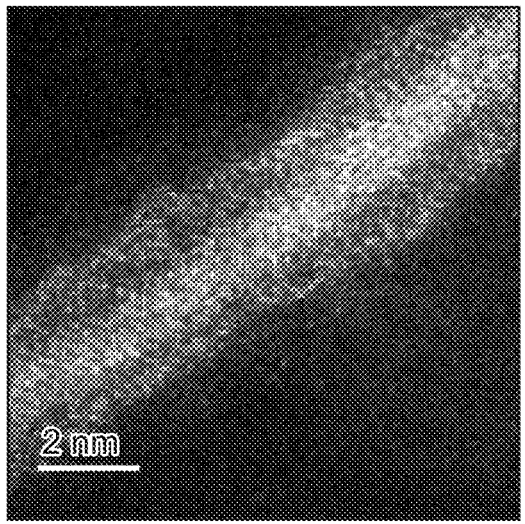
Figure 6D:
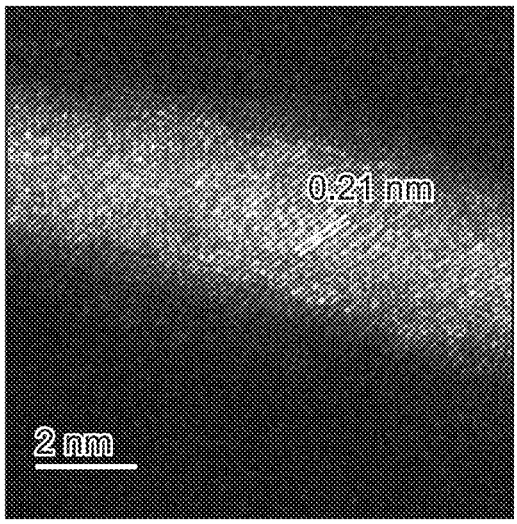

Energy dispersive X-ray spectroscopy (EDS) elemental analysis shows that the overall Pt/Ni molar ratio remains substantially the same (Pt/Ni: 15/85) before and after annealing (FIG. 8A, B), and a weight percentage of Pt is about 3.6%. The HRTEM image of the annealed NW shows a substantially uniform contrast with a resolved lattice spacing of about 0.21 nm throughout the entire NW diameter (FIG. 2E), consistent with the (111) lattice spacing of PtNi alloy. This evolution from the initial core/shell NWs before annealing to substantially uniform alloy NWs after annealing was also confirmed by high-angle annular dark-field scanning transmission electron microscopy (HAADF-STEM) studies (FIG. 6C, D).

Figure 2F:
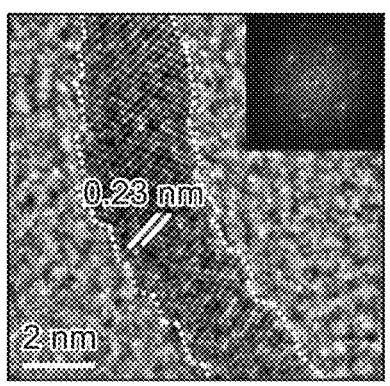
Figure 2G:
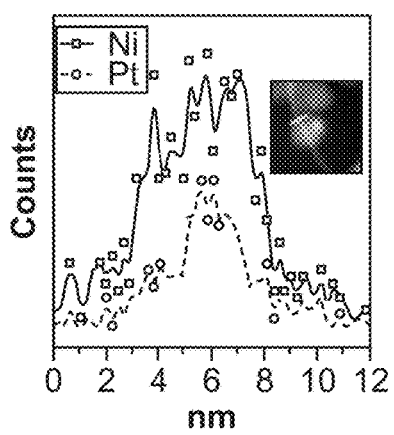
Figure 2H:
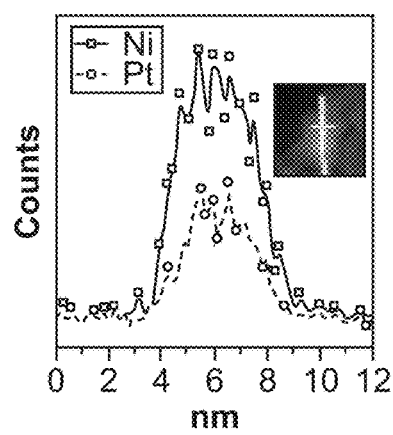
Figure 9:
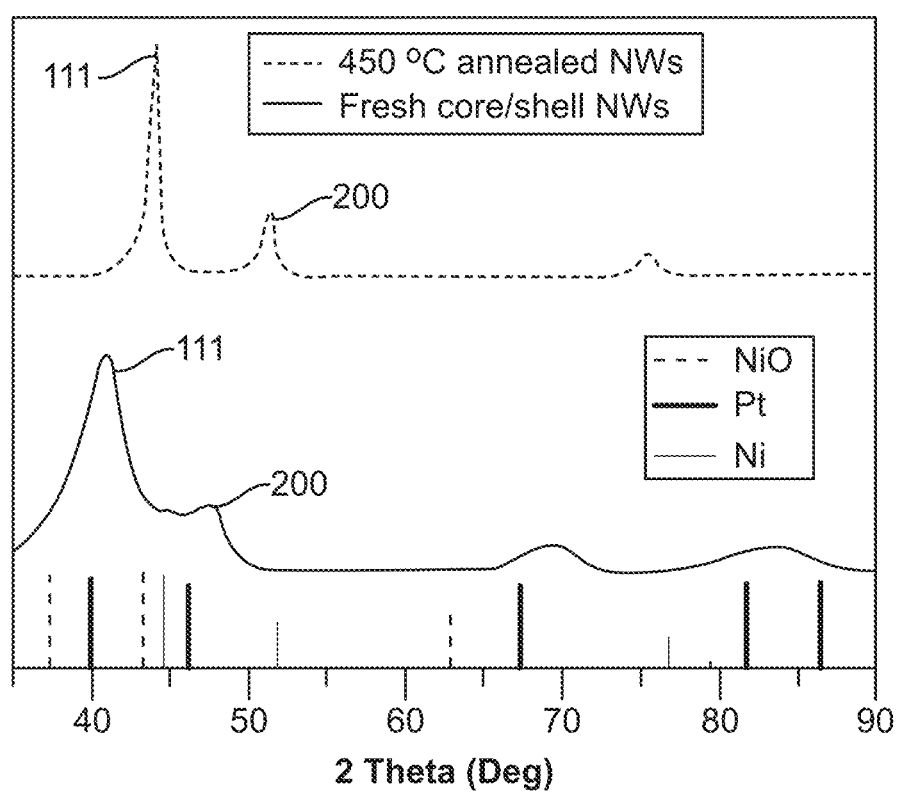
FIG. 9. X-ray diffraction (XRD) spectra comparison of fresh and about 450° C. annealed Pt/NiO core/shell nanowires/C. The standard XRD pattern for fcc NiO, Pt, Ni are displayed as respectively labeled bars. The crystallinity of fresh sample (lower line) showed existence of non-fcc phase, and since the size of Pt core NWs is ultrafine (sub-2 nm), the resulting XRD peak for fresh sample is broadened. The overlapped (111) and (200) peak region may be caused by the existence of NiO. For the about 450° C. annealed sample (upper line), the narrowed symmetric XRD peak indicated the formation of larger alloyed crystal. The resulting (111) peak (2θ=about 44.0°) was relatively closer to Ni (111) (2θ=about) 44.6° than that of Pt (111) (2θ=about 39.7°), which indicates the resulting alloy is Ni-rich and which is consistent with the EDS result (FIG. 8B).

The EDS line scan profile of the as-prepared NWs also confirms the core/shell structure with a Pt core (FIG. 2G) that diffuses homogenously throughout the entire NW after annealing at about 450° C. (FIG. 2H). X-ray diffraction (XRD) studies also confirm the evolution of the initial Pt/NiO core/shell configurations into a substantially fully alloyed PtNi NW structure (FIG. 9). Furthermore, X-ray photoelectron spectroscopy (XPS) studies further demonstrate that the nickel valence state changes from Ni$^{x+}$ in the PtNiO core/shell NWs to mostly Ni⁰ after annealing, consistent with the formation PtNi alloy (FIG. 10).

Figure 3A:
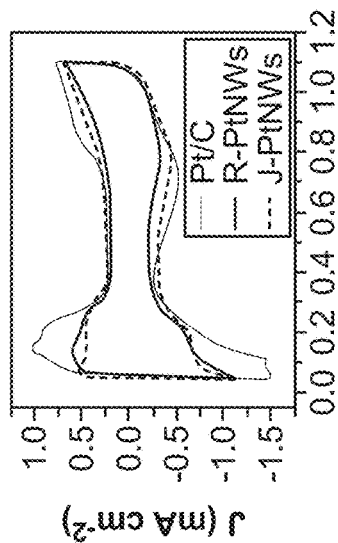
FIG. 3. Electrochemical performance of jagged PtNWs (J-PtNWs) vs. regular synthetic PtNWs (R-PtNWs) and commercial Pt/C. (A) Cyclic voltammetry (CV) curves corresponding to different activation cycles of the de-alloying process, indicating the increasing surface area with the increasing number of CV cycles. (B) The evolution of ECSA with the increasing CV cycles. (C and D) CV and ORR polarization curves for the J-PtNWs, the R-PtNWs, and the Pt/C, respectively. (E and F) Specific activity (SA) and mass activity Tafel plot for the J-PtNWs, the R-PtNWs, and the Pt/C, respectively. The vertical dashed line indicates the 2017 mass activity target set by US Department of Energy (DOE). (G) The comparison of specific activities and mass activities of the J-PtNWs, the R-PtNWs, and the Pt/C at about 0.9 V vs. RHE. (H) ORR polarization curves and mass activity Tafel plot (inset) for the J-PtNWs before and after 6000 CV cycles between about 0.6 and about 1.1 V vs. RHE. The scan rate for the Accelerated Durability Test (ADT) is about 100 mVs$^{-1}$. (I) High-resolution HAADF-STEM image of the J-PtNWs after ADT test. The circled areas indicate defective regions with missing atoms. The inset shows the corresponding FFT image.
Figure 3B:
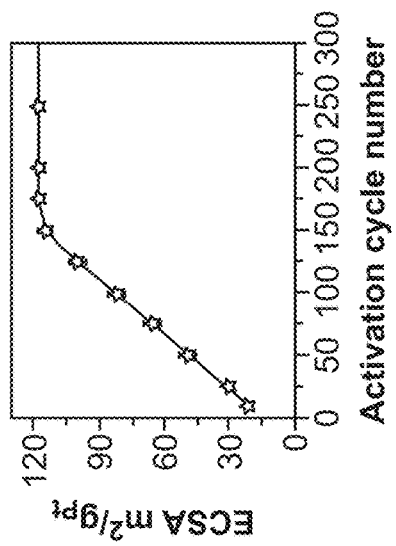

An electrochemical de-alloying (leaching) process was then used to gradually remove Ni atoms from the PtNi alloy NWs, allowing the rearrangement of Pt atoms on a surface to form the J-PtNWs. Cyclic voltammetry (CV) was performed in $N_2$-saturated about 0.1 M $HClO_4$ solution (about 0.05 V to about 1.1 V vs. RHE) with a sweep rate of about 100 $mVs^{-1}$ (FIG. 3A). Based on the CV sweeps, the $ECSA_{Hupd}$ can be derived from the $H_{upd}$ adsorption/desorption peak areas (about 0.05 V<E<about 0.35 V) and the total mass of the loaded Pt. The PtNi alloy NWs initially showed an essentially negligible $ECSA_{Hupd}$ during the first CV cycle. The $ECSA_{Hupd}$ increased steadily with the increasing number of CV cycles (FIG. 3B). Importantly, the NWs were fully activated in about 160 CV cycles to reach a stable $ECSA_{Hupd}$ up to about 118 $cm^2/mg_{Pt}$, which represents the highest ECSA achieved in the optimized Pt electrocatalysts (Table 1).

Figure 2I:
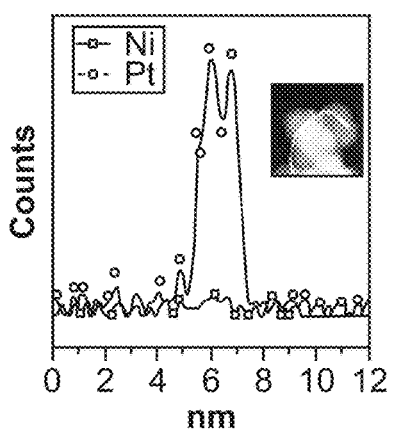
Figure 12:
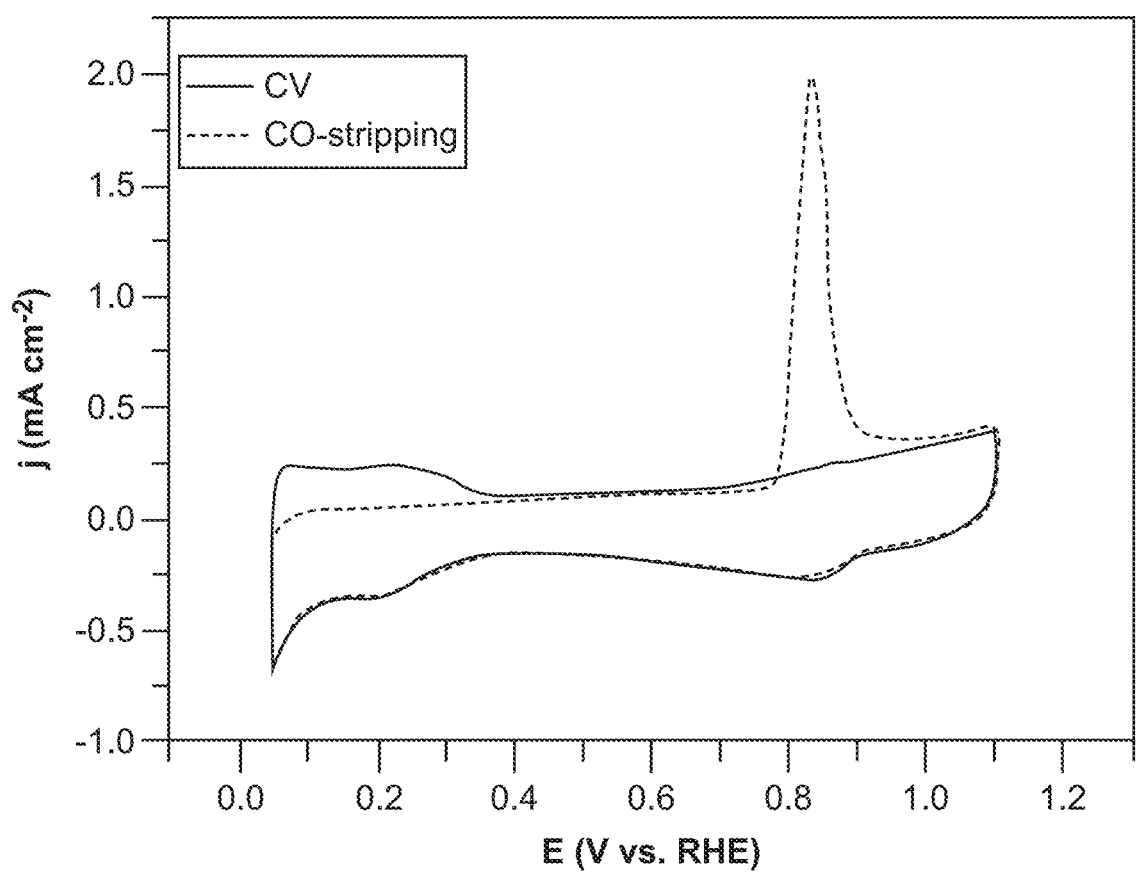
FIG. 12. CO stripping curves of J-PtNWs recorded at room temperature in CO-saturated about 0.1 M HClO$_4$ solution at a scan rate of about 50 mVs$^{-1}$. The current densities were normalized to the geometric area of the RDE (about 0.196 cm$^2$). The ECSA$_{Hupd}$:ECSA$_{CO}$ ratio is about 1:1.05.
Figure 13A:
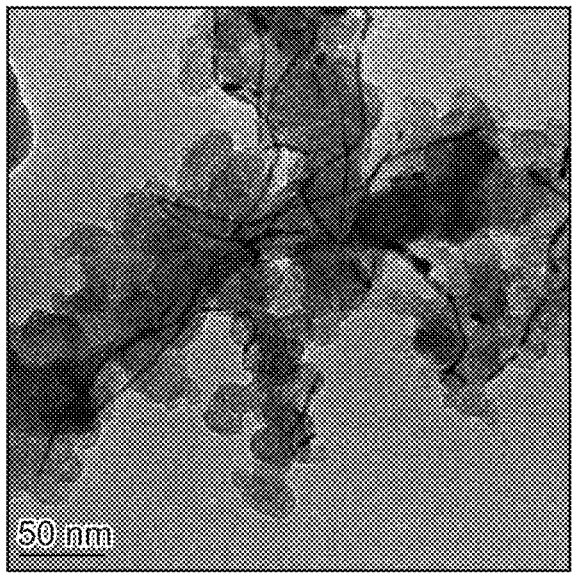
FIG. 13. (A), (C) TEM images, and (B), (D) NWs diameter distribution chart for jagged PtNWs after CV activation and ADT test respectively.
Figure 13B:
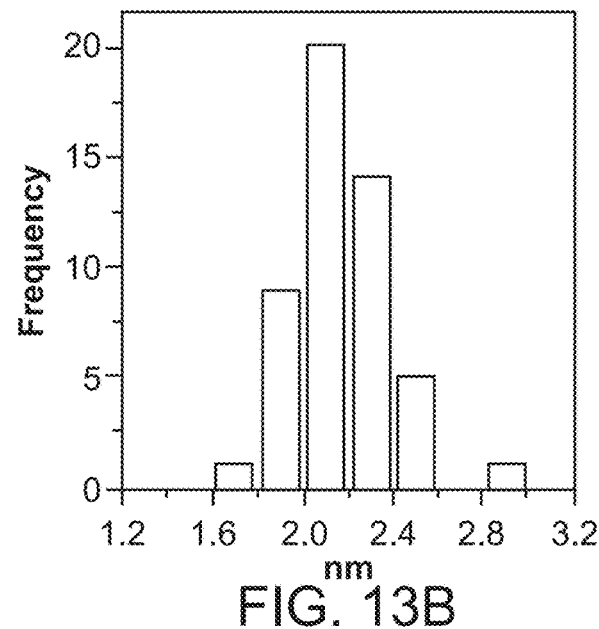
Figure 13C:
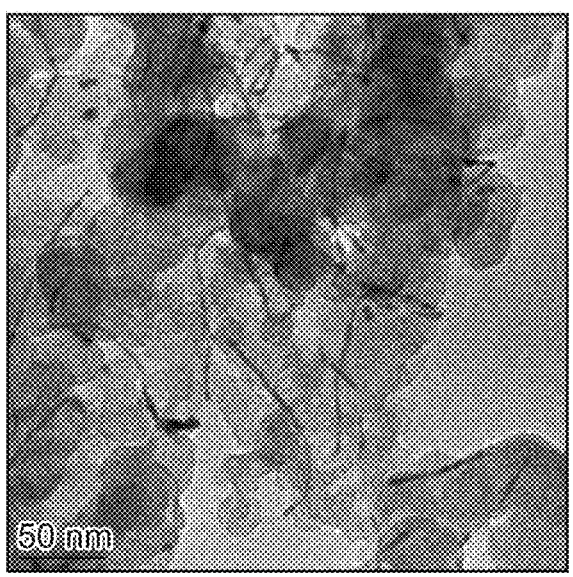
Figure 13D:
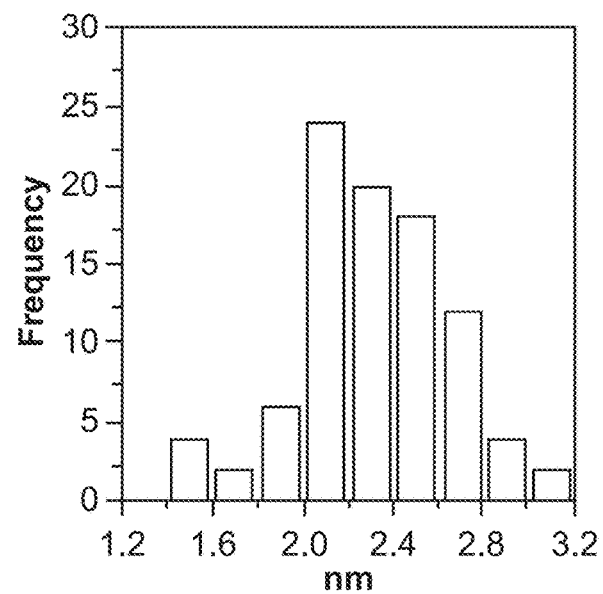

Structural and elemental studies were performed to characterize the fully activated NWs after CV cycles. Low-resolution TEM image shows that the overall NW structure was well-maintained after the electrochemical (or CV) de-alloying process (FIG. 2C). The HRTEM image shows that the overall diameter of the NW considerably shrunk from the initial about 5 nm to about 2 nm after the CV cycles, with substantially unchanged length, and with resolved lattice spacing of about 0.23 nm, consistent with the (111) lattice plane spacing of pure Pt (FIG. 2F). The EDS line-scan shows Pt was substantially solely present in the resulting NWs (FIG. 2I), further confirming that Ni atoms were indeed substantially completely leached away. In addition, the CV scan of the fully activated NWs (after 160 CV cycles) in about 0.1 M KOH showed an absence of typical $Ni^{2+}/Ni^{3+}$ redox signatures, in contrast to the partially activated (150 cycles) PtNi alloy NWs in which the $Ni^{2+}/Ni^{3+}$ redox peaks were prominent (FIG. 11), indicating that Ni atoms have been substantially completely leached away from the alloy NWs after 160 CV cycles. A CO-stripping experiment was also conducted to determine the $ECSA_{CO}$ of J-PtNWs (FIG. 12). The resulting ratio of $ECSA_{Hupd}$:$ECSA_{CO}$ is about 1.00:1.05, which is in agreement with that of typical pure Pt material. Furthermore, TEM studies of the de-alloyed NWs also showed a highly jagged surface (FIGS. 2C, F) with various atomic steps (in contrast to relatively smooth surface observed in typical synthetic PtNWs shown in FIG. 6B). Based on these observations, the resulting nanowires are denoted as jagged PtNWs (J-PtNWs).

Figure 3C:
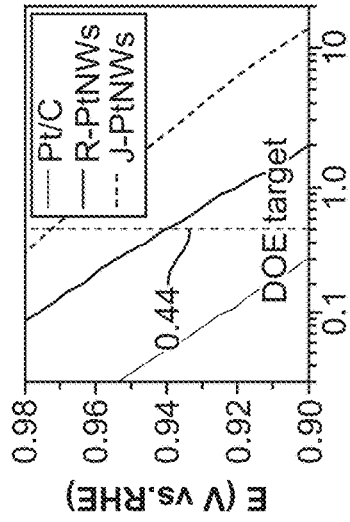

The electro-catalytic performance of the resulting NWs was evaluated and compared with commercial Pt/C catalyst (about 10% mass loading of about 3-5 nm Pt nanoparticles on carbon support) and directly synthesized regular PtNWs (R-PtNWs, about 1.8 nm diameter, FIG. 6B) with relatively smooth surface (the synthesis method is described in the Example section). To assess the ORR activity, all catalysts were loaded onto glassy carbon electrodes (Pt mass loading: about 2.2 μg/cm² for J-PtNWs, about 2.55 μg/cm² for R-PtNWs and about 7.65 μg/cm² for Pt/C catalyst). CV was used to measure the ECSA (FIG. 3C). Overall, the J-PtNWs, R-PtNWs and Pt/C catalysts showed an ECSA of about 118, about 110, and about 74 $m^2/g_{Pt}$, respectively (Table 1). The J-PtNWs displayed the highest ECSA, which can be attributed to their relatively small diameter (about 2.2 nm) and highly jagged surface. It is also interesting to note that the synthetic R-PtNWs also exhibit a rather high ECSA, which can be attributed to their ultra-small diameter (about 1.8 nm).

Figure 3D:
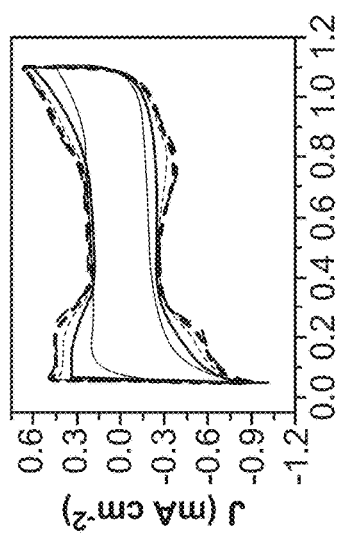
Figure 3E:
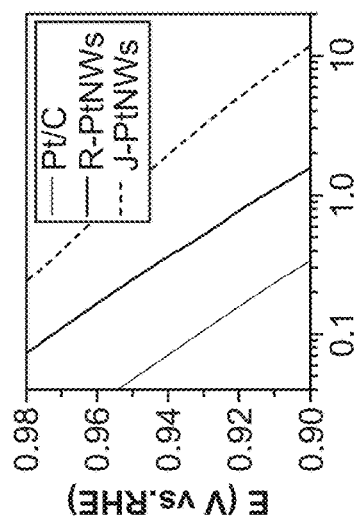
Figure 3F:
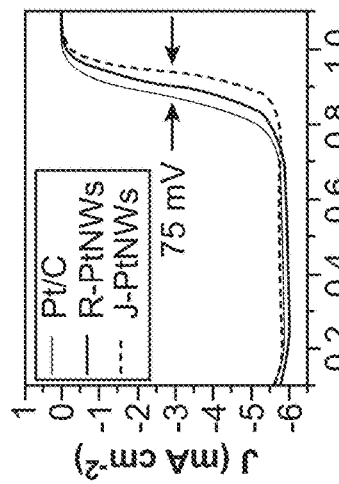

FIG. 3D shows the ORR polarization curves normalized by glassy carbon electrode geometric area (about 0.196 cm²). Significantly, the half-wave potential for the J-PtNWs is at about 0.935 V, which is considerably higher than those of the commercial Pt/C (about 0.860 V) and the R-PtNWs (about 0.899 V), indicating excellent ORR activity of the J-PtNWs. The Koutecky-Levich equation was used to calculate the kinetic current by considering the mass-transport correction. The specific and mass activities were normalized by the ECSA or the total mass of the loaded Pt, respectively. Overall, the J-PtNWs showed a specific activity of about 11.52 mA/cm² at about 0.90 V vs. RHE, far higher than about 0.35 mA/cm² for the Pt/C or about 1.70 mA/cm² for the R-PtNWs tested under the same conditions. Together with their ultrahigh specific surface area, the J-PtNWs deliver a record high mass activity of about 13.59 $A/mg_{Pt}$ at about 0.9 V vs. RHE, which is about 52 times higher than that of the 10% wt. Pt/C (about 0.26 $A/mg_{Pt}$), and more than about 7 times higher than that of the R-PtNWs (about 1.76 $A/mg_{Pt}$) (FIG. 3G) (Table 1). Significantly, the mass activity achieved in the J-PtNWs nearly doubles the highest mass activity value reported for Pt based ORR catalysts. As the current value at about 0.9 V is already very close to the diffusion-limited current in ORR polarization curve, mass activity is also compared at half-wave potential of the J-PtNWs (about 0.935 V) in Table 1. The analysis shows that the J-PtNWs still exhibit an impressive about 48 times higher mass activity than that of Pt/C. The specific activity Tafel plots (FIG. 3E) exhibit a slope of about 51, about 72 and about 74 mV $dec^{-1}$ for J-PtNWs, R-PtNWs and Pt/C, respectively. A considerably smaller slope achieved in the J-PtNWs indicates significantly improved kinetics for ORR. Remarkably, the mass activity Tafel plot (FIG. 3F) shows that the J-PtNWs deliver about 30 times higher mass activity than the 2017 target set by US Department of Energy (about 0.44 $A/mg_{Pt}$ at about 0.90 V, highlighted by dashed line in FIG. 3F).

TABLE 1

Electrochemically active surface area, specific activity, half-wave potential and mass activity of J-PtNWs/C, R-PtNWs/C, Pt/C catalysts, in comparison with those of other representative catalysts.

| | ECSA | SA (mA/cm²) | Half-wave potential | Mass activity (A/mg$_{Pt}$) | |
|---|---|---|---|---|---|
| | (m²/g$_{Pt}$) | @ 0.90 V | (V) | @ 0.90 V | @ 0.935 V |
| J-PtNWs/C (this disclosure) | 118 | 11.52 | 0.935 | 13.59 | 2.87 |
| R-PtNWs/C (this disclosure) | 110 | 1.59 | 0.899 | 1.76 | 0.5 |
| Pt/C (this disclosure) | 74 | 0.35 | 0.860 | 0.26 | 0.06 |
| Octahedron Pt$_{2.5}$Ni/C | 21 | NA | NA | 3.3 | NA |
| Nanoframe Pt$_3$Ni/C | 67.2 | NA | NA | 5.7 | NA |
| Mo-Pt$_3$Ni/C | 67.7 | 10.3 | NA | 6.98 | NA |
| DOE 2017 target | NA | NA | NA | 0.44 | NA |

Figures 3G, 3H, 3I:
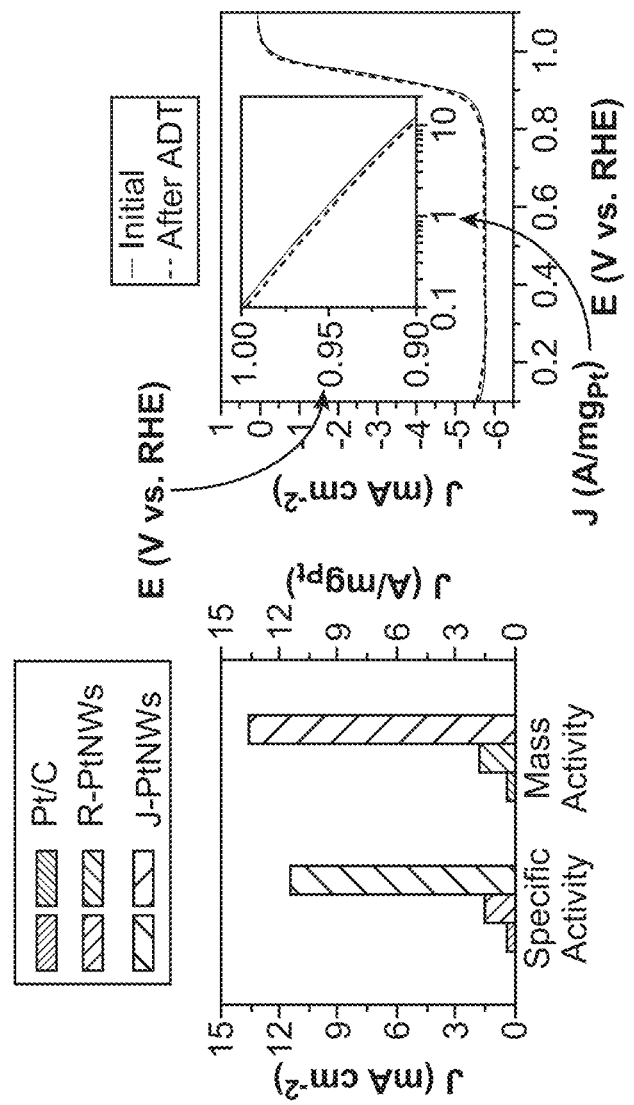

Further evaluation was made of the durability of the J-PtNWs using accelerated deterioration tests (ADT) under a sweep rate of about 100 $mVs^{-1}$ between about 0.6 V and about 1.1 V in $O_2$-saturated about 0.1 M $HClO_4$. After 6000 cycles of repeated CV test, the ECSA dropped by just about 7%, and the specific activity dropped by just about 5.5%, and together the mass activity dropped by just about 12% (FIG. 3H). Indeed, high-resolution STEM studies showed that the jagged surface (with defective sites) was largely preserved after 6000 cycles (FIG. 3I). Statistical analysis shows that average diameter of the J-PtNWs increased from about 2.16 nm to about 2.33 nm after 6000 cycles of ADT (FIG. 13), which may have contributed to the slight loss of the ESCA.

The above studies demonstrate that the J-PtNWs exhibit a high specific surface area and an extraordinary high specific activity for ORR, and together delivering a record-high mass activity. It is important to note that the J-PtNWs exhibit significantly higher specific activity and mass activity (about 11.52 mA/cm$^2$ or about 13.59 A/mg$_{Pt}$ at about 0.9 V) than those of R-PtNWs (about 1.70 mA/cm$^2$ or about 1.87 A/mg$_{Pt}$ at about 0.9 V), despite displaying rather similar ECSA (about 118 m$^2$/g$_{Pt}$ for about 2.2 nm J-PtNWs and about 110 m$^2$/g$_{Pt}$ for about 1.8 nm R-PtNWs).

Figures 15A, 15B, 15C:
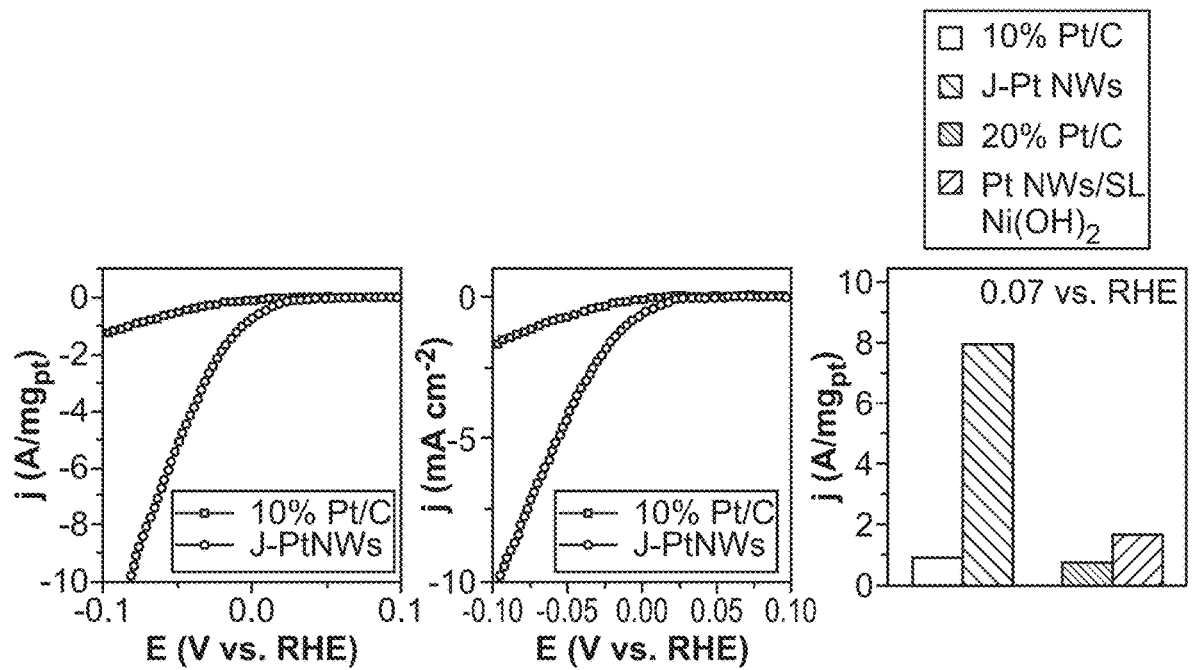
FIG. 15. Hydrogen evolution reaction (HER) (A) mass activity and (B) specific activity of J-PtNWs and Pt/C. (C) Mass activity comparison at about 0.07 V vs. RHE.

To further explore catalytic activity of J-PtNWs, hydrogen evolution reaction (HER) tests are performed on a similar rotation disk system used for ORR tests. The results (FIG. 15) show that J-PtNWs also exhibit exceptional capability for HER. In about 0.1 M KOH electrolyte, J-PtNWs show a mass activity of about 7.9 A/mg$_{Pt}$ at about 0.07 V vs. RHE.

To gain further insight on how the J-PtNWs can deliver dramatically higher ORR activity, reactive molecular dynamics (RMD) studies are conducted using the reactive force field (ReaxFF) to simulate the formation of J-PtNWs by leaching Ni atoms from an initial Pt$_{15}$Ni$_{85}$ alloy NW. The ReaxFF reactive force field was derived from extensive quantum mechanics calculations validated by comparing to experiment. The protocol of Ni removal followed by local geometry optimization and dynamics simulation provides a model to simulate the complex experimental de-alloying process in which Ni surface atoms are leached out with the remaining Pt atoms diffusing towards nearby empty sites (Details for constructing this model are described in the Example section). The RMD simulation resulted in a pure Pt NW containing 8,183 Pt atoms (in a length of about 46 nm) with a diameter of about 2.0 nm and highly jagged surface (FIGS. 1C, 4A and 4B). Notably, the overall morphology of the predicted J-PtNWs resembles closely that of the experimentally obtained J-PtNWs as shown in TEM images (FIGS. 2C, 2F and 3I), both of which show modulating thread-like segments of about 2 nm in diameter, containing constricted regions, bending points and jagged surfaces.

The predicted radial distribution function (RDF) exhibits a well-defined first-neighbor peak at about 2.78 A (FIG. 4D), which compares well with the Pt—Pt first-neighbor distance (about 2.83 Å) in a bulk crystal, whereas the peaks associated with the second and further neighbors were much broader and more blurred, similar to those in nanoparticles (NPs). Nanowires with small diameters (about 2 nm in this case) possess ultrahigh surface area, which can be further enhanced by the surface roughness of a jagged morphology. The van der Waals (vdW) surface area of the simulated J-PtNWs is calculated to be about 105 m$^2$/g$_{Pt}$, which agrees well with the experimental value derived from the ECSA (about 118 m$^2$/g$_{Pt}$). However, the enhancement of surface area alone cannot fully account for the observed record-high ORR mass activity. Stressed and under-coordinated crystalline-like surface rhombi can dramatically decrease the reaction barrier of the rate determining steps of ORR, thus, improving specific ORR activity. Surface rhombi are an ensemble of 4 atoms arranged as two equilateral triangles sharing one edge (see the inset in FIG. 4E) and resembling the triangular tessellation of an fcc (111) surface, which is superior to a square tessellation for ORR activity in the same way that the fcc (111) surface is more ORR-active than other compact fcc surfaces such as fcc (100). Moreover, rhombi that are stressed and under-coordinated but still crystalline-like exhibit smaller overall energy barriers for ORR than those encountered on the rhombi of the fcc (111) surface, as predicted via density-functional theory (DFT) calculations.

Figure 14:
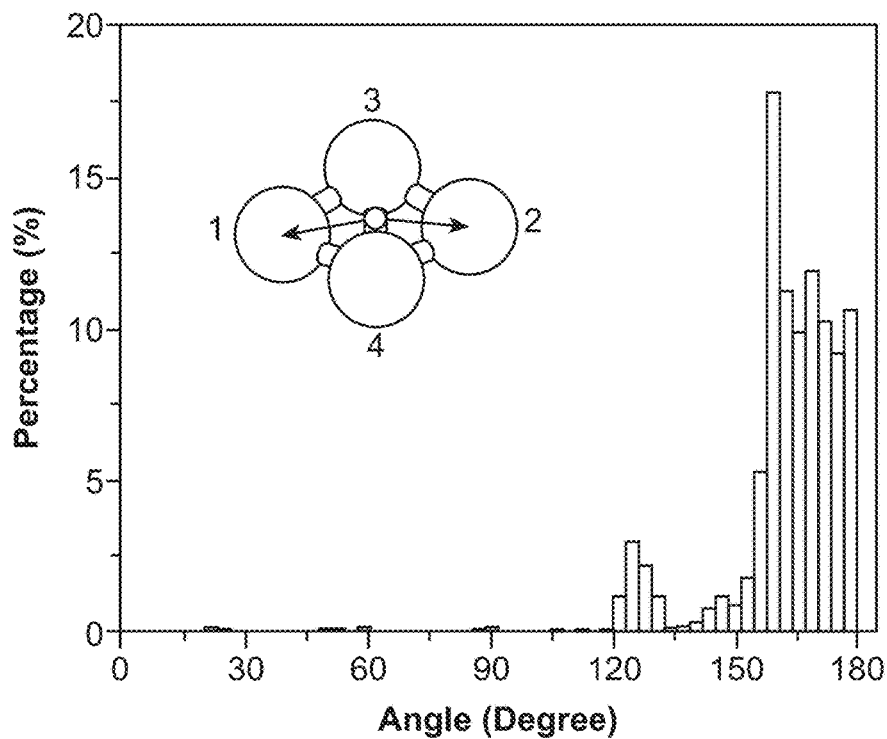
FIG. 14. Schematic depiction of a rhombus (inset) and the distribution of the dihedral angle between the two triangles of the rhombus as specified by the angle formed between the two lines connecting atoms 1 and 2 to the middle point of atoms 3 and 4 respectively (highlighted by the arrows in the inset). Most of the angles are between about 156° and about 180°, which indicate that the surface of the J-PtNWs is highly comparable to a typical crystalline structure.

Several factors can contribute to the greatly enhanced ORR activity in the J-PtNWs. First, the analysis shows that the coordination number of surface atoms of the J-PtNWs ranges mostly between 6 and 8 (FIG. 4D), indicating that these surface atoms are under-coordinated when compared to typical crystal surfaces (with coordination numbers of 8 or 9 for (100) or (111) facets, respectively). Despite the low-coordination number and jagged feature, the crystalline-like character of surface atoms in J-PtNWs is confirmed from Common Neighbor Analysis (CNA). CNA result shows that the ratio of CNA [5, 5, 5] triplets (a finger print of icosahedral structure) to the total number of CNA triplets is rather low (about 85% of the atoms have a ratio below about 0.0065) (FIG. 4B). Since the bonded pairs of type [5, 5, 5] are characteristic of icosahedral order, this low [5, 5, 5] ratio indicates a more crystalline-like feature for the established model, which is also a factor for enhancing ORR activity. Indeed, such crystalline-like character of the simulation model is consistent with the experimental FFT images (insets in FIGS. 2F and 3I) showing that the J-PtNWs remain fcc-like after CV activation and repeated cycling test. Additionally, the distribution of rhombus dihedral angles (FIG. 14) shows that most of the dihedral angles formed between the two triangles of the rhombus range between about 156° and about 180°. Comparing with about 180° for typical crystalline Pt (111) facet, this statistical analysis further confirms the high-crystallinity nature of the J-PtNWs, which is favorable for increased reactivity. Second, it is also found that the surface atoms in the J-PtNWs exhibit rather high value of atomic stress about 10 times larger than that for regular (100) or (111) facets (FIGS. 4A and 4E). The mechanical strain can decrease the binding energy of adsorbents on close-packed surfaces, which can make the surfaces more active, further contributing to the activity enhancement. Finally and importantly, it is found that the J-PtNWs possess both large ECSA (see Table 2 of the Example section) and exhibit an unusually high number of the ORR-favorable rhombic structures on the surface. There are about 85% rhombi per surface atom in the J-PtNW surface (Table 2), considerably higher than about 57% for the nanoporous Pt-NPs. Together, the J-PtNW surface sites are stressed, under-coordinated, crystalline-like, and exhibiting unusually high number of surface rhombi, leading to an ORR-favorable catalytic surface and greatly increased activity.

The experimental studies demonstrate that the formation of ultrafine J-PtNWs provides an extraordinary ORR activity that nearly doubles the highest reported Pt mass activity. The computational analysis indicates that this exceptional activity arise from surface configurations with richly populated rhombic structures that are crystalline-like but under-coordinated and stressed to reduce the barriers for the rate determining step of ORR, leading to greatly improved specific activity. Additionally, by adopting the 1D NW geometry, the ultrafine J-PtNWs (about 2 nm) can exhibit exceptionally high and stable ECSA. To achieve a high ECSA typically involves nanoparticles as small as possible (e.g., <about 3 nm), which typically are rather mobile on carbon supports, tending to move and aggregate and thereby losing their high surface area and overall activity. Consequently, other approaches have been largely been constrained to nanoparticles with sizes larger than about 5 nm. In contrast, the J-PtNWs on a carbon support form multiple-anchor-point line contacts that firmly lock the NWs in place, ensuring they do not migrate and aggregate during CV cycles. Thus, ultrafine J-PtNWs (about 2 nm) can function as stable ORR catalysts to offer an unprecedented ECSA, nearly doubling that of the best reported catalysts. Furthermore, the multi-point line contacts between the J-PtNWs and the carbon support offer a much greater possibility for efficient charge transport and collection, since electrons generated at active surface sites can be efficiently transported along the metallic NWs and across PtNW/carbon interface through the multi-point line contacts to reach the conductive carbon support and be collected by an electrode. With multi-point contact with a carbon support, the 1D nanowire electrocatalyst is less mobile and thus more stable, and can offer more efficient charge transport from catalytic site to the carbon support, and lead to a more robust electrocatalyst with higher precious metal utilization efficiency. In contrast, the single point contact between a nanoparticle catalyst and the carbon support may not offer an optimal electronic interface for efficient charge transport to the carbon support. Moreover, it is noted that the record-high ORR activity is achieved in substantially pure Pt material instead of alloys with non-precious metals, which can also partially address the instability issues associated with the leaching of non-precious metal from the alloy catalysts.

Performance tests demonstrate that the disclosed de-alloying approach can successfully yield electrochemically active nanowires to catalyze both ORR and HER. J-PtNWs show a high mass activity (about 13.59 A/$mg_{Pt}$) for ORR at about 0.9 V vs. RHE, and also a robust mass activity (about 7.9 A/$mg_{Pt}$) for HER. The 1D structure can provide an efficient electronic interface for charge transport to a carbon support, and the highly jagged Pt surface can also accelerate electrocatalyst kinetics.

More generally, some embodiments of this disclosure are directed to a manufacturing method of forming jagged Pt nanowires for use as an electrocatalyst. In some embodiments, the manufacturing method includes: (1) providing Pt-M' nanowires; and (2) subjecting the Pt-M' nanowires to electrochemical de-alloying to form jagged Pt nanowires.

In some embodiments of the method, M' represents one or more sacrificial metals different from Pt, such as where M' is at least one metal selected from transition metals of Group 3, Group 4, Group 5, Group 6, Group 7, Group 8, Group 9, Group 10, Group 11, and Group 12 of the Periodic Table, as well as post-transition metals, and with M' being different from Pt. In some embodiments, M' is selected from nickel (Ni), titanium (Ti), vanadium (V), iron (Fe), cobalt (Co), copper (Cu), ruthenium (Ru), palladium (Pd), silver (Ag), molybdenum (Mo), tungsten (W), and tin (Sn). In some embodiments, M' is Ni. In some embodiments, M' includes two different sacrificial metals $M'_1$ and $M'_2$, where $M'_1$ and $M'_2$ are different metals selected from transition metals and post-transition metals, such as selected from Ni, Ti, V, Fe, Co, Cu, Ru, Pd, Ag, Mo, W, and Sn. In some embodiments, M' includes three or more different sacrificial metals.

In some embodiments of the method, the Pt-M' nanowires include an alloy of Pt and M' that can be represented by the formula $Pt_xM'_y$, where "x" represents a molar content (e.g., expressed as a percentage) of Pt, and "y" represents a molar content of M'. In some embodiments, each of x and y has a non-zero value, and subject to the condition that x+y=100 (or 100%). In some embodiments, x<y. In some embodiments, y has a non-zero value in a range of about 20 to about 90, such as about 30 to about 90, about 40 to about 90, about 50 to about 90, about 60 to about 85, or about 70 to about 85. In some embodiments, subjecting the Pt-M' nanowires to electrochemical de-alloying in (2) includes selectively removing M' from the Pt-M' nanowires such that a molar content of M' in the resulting jagged Pt nanowires is no greater than about 5 (or 5%), such no greater than about 4 (or 4%), no greater than about 3 (or 3%), no greater than about 2 (or 2%), no greater than about 1 (or 1%), or no greater than about 0.5 (or 0.5%).

In some embodiments of the method, providing the Pt-M' nanowires in (1) includes providing the Pt-M' nanowires affixed to a catalyst support, such as carbon black. In place of, or in combination with, carbon black, another catalyst support having suitable electrical conductivity can be used, such as another carbon-based support in the form of graphene, carbon fiber paper, or carbon cloth, as well as metallic foams, among others.

In some embodiments of the method, providing the Pt-M' nanowires in (1) includes: (1a) forming core/shell nanowires with cores including Pt and shells including an oxide of M'; and (1b) subjecting the core/shell nanowires to thermal annealing to form the Pt-M' nanowires.

In some embodiments of the method, forming the core/shell nanowires in (1a) includes reacting a Pt-containing precursor and a M'-containing precursor in a liquid medium. Suitable Pt-containing precursors include an organometallic coordination complex of Pt with an organic anion, such as acetylacetonate, and suitable M'-containing precursors include an organometallic coordination complex of M' with an organic anion, such as acetylacetonate. The liquid medium includes one or more solvents, such as one or more organic solvents selected from polar aprotic solvents, polar protic solvents, and non-polar solvents. In some embodiments, a solvent included in the liquid medium also can serve as a reducing agent for reduction of Pt and M', although the inclusion of a separate reducing agent is also contemplated. In some embodiments, a structure-directing agent, such as polyvinylpyrrolidone (PVP), is also included in the liquid medium to promote a desired nanowire morphology, along with a source of carbonyl (CO), such as tungsten hexacarbonyl (W(CO)$_6$). Reaction can be carried out under agitation and under conditions of a temperature in a range of about 100° C. to about 250° C. or about 100° C. to about 200° C., and a time duration in a range of about 1 hour to about 12 hours or about 2 hours to about 10 hours.

In some embodiments of the method, subjecting the core/shell nanowires to thermal annealing in (1b) is carried out under conditions of a temperature in a range of about 300° C. to about 600° C. or about 400° C. to about 500° C. in a reducing atmosphere.

In some embodiments of the method, subjecting the Pt-M' nanowires to electrochemical de-alloying in (2) includes subjecting the Pt-M' nanowires to cycling, via cyclic voltammetry (CV), in the presence of an acidic solution as an electrolyte to selectively remove M' from the Pt-M' nanowires. In some embodiments, CV is carried out in a voltage range of about 0.05 V to about 1.1 V vs. RHE with a sweep rate of about 100 mVs$^{-1}$. In some embodiments, about 10 or more CV cycles are carried out, such as about 30 or more CV cycles, about 50 or more CV cycles, about 80 or more CV cycles, about 100 or more CV cycles, about 130 or more CV cycles, about 150 or more CV cycles, or about 160 CV cycles.

Some embodiments of the method can be further extended in which Pt is more generally replaced with M, where M represents one or more functional (e.g., catalytic) metals, such as where M is at least one noble metal, such as selected from Pt, Ru, Pd, Ag, rhodium (Rh), osmium (Os), iridium (Ir), and gold (Au). In some embodiments, M includes two different functional metals $M_1$ and $M_2$, where $M_1$ and $M_2$ are different noble metals, such as selected from Pt, Ru, Pd, Ag, Rh, Os, Ir, and Au. In some embodiments, M includes three or more different functional metals.

Some embodiments of the method can be further extended in which nanowires are more generally replaced with nanostructures, which can also include nanoparticles having aspect ratios of about 3 or less. For example, in some embodiments, the manufacturing method includes: (1) providing Pt-M' nanoparticles (or other nanostructures); and (2) subjecting the Pt-M' nanoparticles to electrochemical dealloying to form Pt nanoparticles.

In some embodiments, resulting jagged Pt nanowires have one or more of the following characteristics: (1) the nanowires have lateral dimensions or extents (e.g., in terms of an average width or an average diameter) in a range of up to about 10 nm, up to about 5 nm, up to about 4 nm, up to about 3.5 nm, up to about 3 nm, up to about 2.8 nm, up to about 2.5 nm, up to about 2.3 nm, up to about 2.2 nm, or up to about 2 nm, and down to about 1.8 nm, down to about 1.5 nm, or less; (2) the nanowires have longitudinal dimensions or extents (e.g., in terms of an average length) in a range of at least about 100 nm, at least about 150 nm, at least about 200 nm, or at least about 250 nm, and up to about 500 nm, up to about 1000 nm, or more; (3) the nanowires have a molar content of Pt (or more generally M) of at least about 95 (or 95%), at least about 96 (or 96%), at least about 97 (or 97%), at least about 98 (or 98%), at least about 99 (or 99%), or at least about 99.5 (or 99.5%); (4) the nanowires have jagged exterior surfaces with a high surface roughness (e.g., a root mean square roughness of at least about 0.3×atomic size of Pt (or more generally M), such as at least about 0.5×atomic size, at least about 0.8×atomic size, or at least about 1×atomic size) and with a high percentage of rhombic structures on the exterior surfaces (e.g., at least about 58% rhombi per surface atom, such as at least about 65% rhombi per surface atom, at least about 75% rhombi per surface atom, or about 85% rhombi per surface atom); and (5) the nanowires each have one or more bending points or regions such that an axial direction varies by about 5° or more, about 8° or more, about 10° or more, about 12° or more, or about 15° or more across each such bending region.

In some embodiments, a catalyst material includes jagged Pt nanowires that are loaded on, dispersed in, affixed to, anchored to, or otherwise connected to a catalyst support. In some embodiments, the catalyst material has an electrochemical active surface area of at least about 80 $m^2/g_{Pt}$, at least about 90 $m^2/g_{Pt}$, at least about 100 $m^2/g_{Pt}$, at least about 110 $m^2/g_{Pt}$, at least about 115 $m^2/g_{Pt}$, or about 118 $m^2/g_{Pt}$, a mass activity for ORR at about 0.9 V vs. RHE of at least about 4 $A/mg_{Pt}$, at least about 6 $A/mg_{Pt}$, at least about 8 $A/mg_{Pt}$, at least about 10 $A/mg_{Pt}$, at least about 12 $A/mg_{Pt}$, or about 13.59 $A/mg_{Pt}$, and a mass activity for HER at about 0.07 V vs. RHE of at least about 3 $A/mg_{Pt}$, at least about 5 $A/mg_{Pt}$, at least about 7 $A/mg_{Pt}$, or about 7.9 $A/mg_{Pt}$.

Nanowire-based catalyst materials of embodiments of this disclosure can benefit a wide range of applications, including catalyzing ORR and HER (e.g., for fuel cells and air batteries), oxygen evolution reaction and HER (e.g., for water splitting or hydrogen generation), for $CO_2$ reaction (e.g., $CO_2$ reduction), $N_2$ reaction (e.g., $N_2$ reduction in ammonia synthesis), methanol oxidation reaction (MOR), CO oxidation, and ethanol oxidation reaction (EOR), among others.

Figure 5:
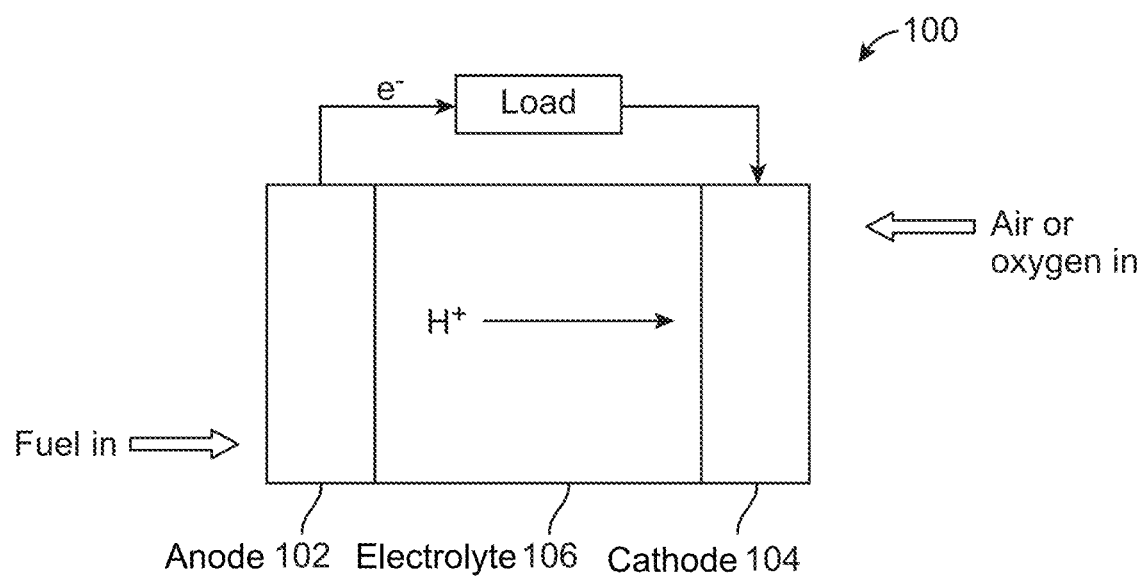
FIG. 5. Schematic of a fuel cell.

FIG. 5 is a schematic of a fuel cell 100 according to some embodiments of this disclosure. The fuel cell 100 includes an anode 102, a cathode 104, and an electrolyte 106 that is disposed between the anode 102 and the cathode 104. In the illustrated embodiments, the fuel cell 100 is a proton-exchange membrane (PEM) fuel cell, in which the electrolyte 106 is implemented as a proton-exchange membrane, such as one formed of polytetrafluoroethylene or other suitable fluorinated polymer. During operation of the fuel cell 100, a fuel (such as hydrogen or an alcohol) is oxidized at the anode 102, and oxygen is reduced at the cathode 104. Protons are transported from the anode 102 to the cathode 104 through the electrolyte 106, and electrons are transported over an external circuit load. At the cathode 104, oxygen reacts with the protons and the electrons, forming water and producing heat. Either one, or both, of the anode 102 and the cathode 104 can include a nanowire-based catalyst material as set forth in this disclosure. For example, the cathode 104 can include a jagged Pt nanowire-based electrocatalyst.

EXAMPLE

The following example describes specific aspects of some embodiments of this disclosure to illustrate and provide a description for those of ordinary skill in the art. The example should not be construed as limiting this disclosure, as the example merely provides specific methodology useful in understanding and practicing some embodiments of this disclosure.

Materials and Methods

1. Chemicals:

Platinum(II) acetylacetonate (Pt(acac)$_2$, about 97%), nickel(II) acetylacetonate (Ni(acac)$_2$, about 95%), cobalt (II) acetylacetonate (Co(acac)$_2$, about 97%), glucose, tungsten (0) hexacarbonyl (W(CO)$_6$, about 97%), polyvinylpyrrolidone (PVP mw. about 40,000), Oleylamine (>about 70%), 1-octadecene (ODE, >about 90%), Ethanol (about 200 proof), perchloric acid (HClO$_4$, about 70%, PPT Grade) were all purchased from Sigma-Aldrich. All aqueous solutions were prepared using deionized (DI) water (about 18.2 MΩ/cm) obtained from an ultra-pure purification system (Aqua Solutions).

2. Preparation of Jagged Pt Nanowire (J-PtNW) Catalysts

The Pt/NiO NWs were prepared using a facile one-pot synthesis. In a typical synthesis, about 0.025 mmol Pt(acac)$_2$, about 0.10 mmol Ni(acac)$_2$ and about 0.75 mmol glucose were pre-dissolved in mixture of about 2 mL 1-octadecene (ODE) and about 3 mL oleylamine (OAm). After sonication for about 10 min, about 0.0015 mmol PVP (mw. about 40,000) and about 0.0050 mmol W(CO)$_6$ were added into the pre-dispersed solution and sealed with argon. The mixture was further heated up to about 140° C. for about 6 hours to obtain Pt/NiO core/shell nanowires, which were then washed and cleaned using acetone/cyclohexane/ethanol mixture, and collected by centrifuging at about 7000 rpm.

The as-prepared Pt/NiO NWs were suspended in about 15 mL cyclohexane/ethanol mixture. To load the sample onto carbon black, about 36 mg of carbon black was added for each about 4 mg Pt/NiO NWs and sonicated for about 2 hours. The resulting Pt/NiO-NWs/C catalysts were collected by centrifugation and cleaned with cyclohexane/ethanol mixture, placed in an alumina boat and annealed at about 450° C. in Ar/H$_2$: about 97/3 with about 100 sccm flow rate in a custom-build tube furnace.

Electrochemical de-alloying was performed as follows. About 13 to 26 μg of PtNi NWs/C was loaded on a glassy carbon rotation disk electrode with a geometry area of about 0.196 cm$^2$. About 40 mL of about 0.1 M perchloric acid was used as the electrolyte. Pt wire and Ag/AgCl (1 M Cl$^-$) were used as the counter and reference electrodes respectively. Cyclic voltammetry (CV) activations were performed as explained below.

3. Preparation of Regular Pt Nanowire (R-PtNW) Catalysts

In a typical synthesis, about 0.025 mmol platinum Pt(acac)$_2$, about 0.10 mmol Co(acac)$_2$ and about 0.75 mmol glucose were pre-dissolved in mixture of about 2 mL 1-octadecene (ODE) and about 3 mL oleylamine (OAm). After sonication for about 10 min, about 0.0015 mmol PVP (mw. about 40,000) and about 0.0050 mmol W(CO)$_6$ were added into the pre-dispersed solution and sealed with argon. The mixture was further heated up to about 120° C. for about 3 hours to obtain regular nanowires. After cleaning the product by acetone/cyclohexane/ethanol mixture, the R-PtNWs were collected by centrifuging at about 7000 rpm, and re-suspended in about 15 mL cyclohexane/ethanol mixture and loaded onto carbon black using the same approach described above, followed by a moderate annealing at about 250° C.

4. Preparation of Pt—Ni Nanoparticles

In a typical synthesis, about 0.025 mmol platinum Pt(acac)$_2$, about 0.075 mmol Ni(acac)$_2$ and about 0.75 mmol glucose were pre-dissolved in a mixture of about 2 mL 1-octadecene (ODE) and about 3 mL oleylamine (OAm). After sonication for about 10 min, about 0.0015 mmol PVP (mw. about 40,000) and about 0.050 mmol W(CO)$_6$ were added into the pre-dispersed solution and sealed with argon. The mixture was further heated up to about 170° C. for about 6 hours with stirring to obtain PtNi nanoparticles (NPs). After cleaning with a mixture of acetone/cyclohexane/ethanol, the PtNi NPs were collected by centrifuging at about 12,000 rpm, and re-suspended in about 15 mL cyclohexane/ethanol mixture and loaded onto carbon black using the same approach described above, followed by a thermal annealing at about 450° C.

5. Structure and Composition Characterization

Figure 8A:
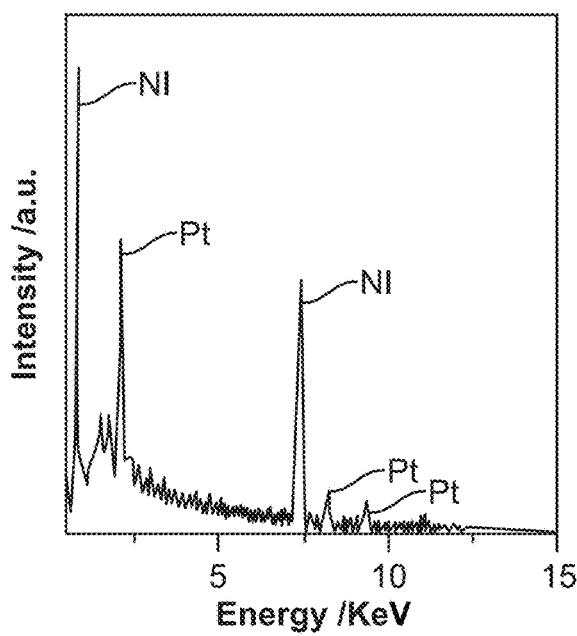
FIG. 8. (A) EDS spectrum of the as-prepared Pt/NiO core/shell NWs. (B) EDS spectrum the Pt—Ni alloy NWs obtained after about 450° C. annealing.
Figure 8B:
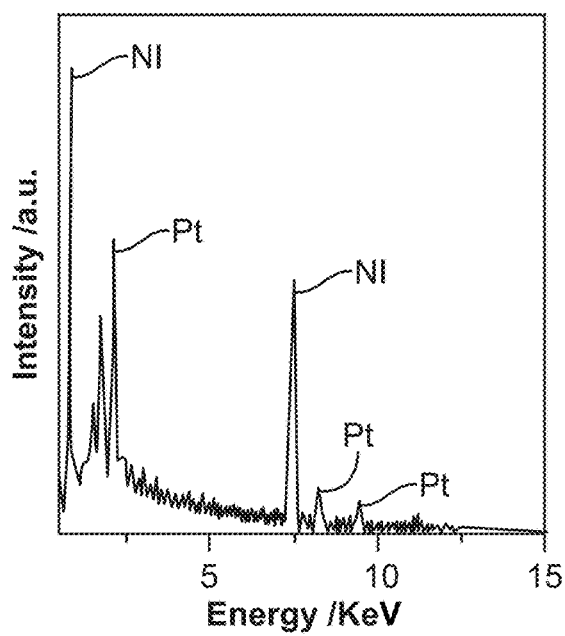

Scanning electron microscopy (SEM) images and energy-dispersive X-ray spectroscopy (EDS) results were collected on ZEISS Supra 40VP SEM. The EDS analysis of the as-prepared Pt/NiO core/shell NWs showed a Pt/Ni molar ratio of about 15/85 (FIG. 8A, B).

Powder X-ray diffraction (XRD) patterns were collected on a Panalytical X'Pert Pro X-ray Powder Diffractometer with Cu-Kα radiation.

X-ray photoelectron spectroscopy (XPS) tests were performed with Kratos AXIS Ultra DLD spectrometer. Transmission electron microscopy (TEM) images were carried out on an FEI T12 transmission electron microscope operated at about 120 kV. High resolution TEM (HRTEM) images, and EDS line-scan files were taken on FEI TITAN transmission electron microscope operated at about 300 kV. High-angle annular dark-field scanning transmission electron microscopy (HAADF-STEM) was performed on aberration-corrected TEM device. The samples were prepared by dropping ethanol dispersion of catalysts onto carbon-coated molybdenum TEM grids.

The concentration of catalysts was determined by inductively coupled plasma (ICP) atomic emission spectroscopy. The ICP sample used for jagged Pt nanowires was annealed before electrochemical activation. The Pt loading for J-PtNWs was about 2.2 μg/cm$^2$ on glassy carbon electrode. ICP test for electrolyte after activation showed no detectable Pt, indicating no Pt atoms were leached off.

6. Electrochemical Experiments

Electrochemical experiments were conducted using a three-electrode cell system. The working electrode was a glassy carbon rotating disk electrode (RDE) from Pine Instruments, and the glassy carbon geometry area is about 0.196 cm$^2$. Pt wire and Ag/AgCl (about 1 M Cl$^-$) were used as the counter and reference electrodes, respectively. Pt loadings were about 2.2 μg/cm$^2$, about 2.55 μg/cm$^2$, and about 7.65 μg/cm$^2$ for J-PtNWs, R-PtNWs, and Pt/C, respectively (All the loading mass were normalized over the geometric electrode area of about 0.196 cm$^2$).

Cyclic voltammetry (CV) activations were performed in N$_2$-saturated about 0.1 M HClO$_4$ electrolyte with a potential scan rate of about 100 mVs$^{-1}$. All the electrochemical active surface area (ECSA) tests were determined by integrating hydrogen adsorption charge on CV curve by assuming a value of about 210 μC/cm$^2$ for the adsorption of a hydrogen monolayer. Double-layer correction was applied. The ECSA for J-PtNWs, R-PtNWs, and Pt/C were calculated via the same method.

Oxygen reduction reaction (ORR) tests were conducted in N$_2$-saturated about 0.1 M HClO$_4$ electrolyte with a potential scan rate of about 20 mVs$^{-1}$. The current density of ORR polarization curve was iR-corrected during the measurements.

The stability test was performed at room temperature in O$_2$-saturated about 0.1 M HClO$_4$ solution with a potential scan rate of about 100 mVs$^{-1}$.

Hydrogen evolution reaction (HER) tests were conducted as follows. The J-PtNWs were firstly activated via CV de-alloying process as described above, and then rinsed with de-ionized water. HER tests were conducted in N$_2$-saturated about 0.1 M KOH electrolyte with a potential scan rate of about 10 mVs$^{-1}$. Resulting mass activity is about 7.9 A/mg$_{Pt}$ at about 0.07 V vs. RHE, almost 10 times higher than that of the commercial Pt/C material. The current density of HER polarization curve was iR-corrected during the measurements.

For CV test in alkaline solution, the J-PtNWs and partially activated (about 150 cycles) Pt—Ni alloy nanowires were firstly activated in N$_2$-saturated about 0.1 M HClO$_4$ electrolyte with a potential scan rate of about 100 mVs$^{-1}$. After rinsing the electrode with DI water, the CV was performed in N$_2$-saturated about 0.1 M KOH electrolyte at a scan rate of about 50 mVs$^{-1}$.

7. Computational Studies

To generate realistic structural models of PtNi alloy nanowires, a computational protocol to simulate Ni de-alloying of Pt$_3$Ni$_7$ nanoparticles (0D system) is extended. Thus:

1). The modeling started from an infinite nanowire (1D system), based on the fcc Pt crystal structure. The z axis of the nanowire is along the (111) crystal direction, while in the xy plane, 13 Pt atoms are located along the x axis and 9 Pt atoms are located along the y axis. This choice was made to expose some (100) facets along the NW axis.

2) The modeling built a periodic model by replicating 220 individual unit cells along the axis of the wire.

3) The overall ratio of Ni to Pt is 85:15, consistent with experiment, which was achieved by randomly replacing 15% of the Pt atoms with Ni atoms, while ensuring that the Ni composition is roughly constant along the nanowire axis.

4) The modeling erased all of the Ni atoms and performed a fixed-cell conjugate-gradient local relaxation. Here, each conjugate-gradient step constrains the maximum change in Cartesian coordinates to 0.1 A to ensure a smooth local minimization that avoids disruption of the original random fcc framework. The convergence threshold criteria are $4 \times 10^{-6}$ eV on the energy and $4 \times 10^{-8}$ eV/A on the gradient.

5) The modeling performed a second local relaxation allowing the cell dimension in the z-direction to equilibrate at a pressure of 1 atm.

6) The modeling performed a final NPT Molecular Dynamics (MD) simulation at 343 K for 520 ps (20 ps equilibration followed by a 500 ps run).

This protocol, in which the modeling simultaneously removes Ni throughout the initial fcc nanostructure and locally relaxes and equilibrates the resulting configuration, is designed as a simplified mimic of the complex kinetics-driven de-alloying process induced during electrochemical activation, where Ni surface atoms are progressively leached out of the system. The ReaxFF reactive force can be used in a more realistic gradual depletion of the Ni atoms under realistic conditions, but the size of the system and the long time scales of ORR-induced de-alloying make this more realistic simulation impractical. However, the smooth local minimization of the initial randomly sparse fcc framework of Pt atoms provides a reasonable approximation to the relaxation processes through metastable configurations that retain memory of the original pattern. An assumption made that all Ni atoms are removed in step (4) corresponds to, in a nanoparticle study, propagating the topmost 4/6 surface layers devoid of Ni into the bulk. The experimental evidence showing that substantially all Ni atoms are leached out in these small diameter nanowires justifies this approach.

The nanowire structural characteristics are compared with those of the $Pt_3Ni_7$ nanoporous particle obtained by de-alloying a 10-nm-diameter fcc $Pt_3Ni_7$ nanoparticle as a representative nanoparticles exhibiting peak ORR performance.

Thus the Comparison Uses:
1) Radial distribution functions (RDF);
2) A coordination vector threshold to distinguish surface and bulk atoms;
3) Number of first neighbors (coordination number);
4) Atomic stress and 5-fold index; and
5) Analysis of surface arrangement in terms of rhombic structures.

The jagged Pt nanowire exhibits structural features that are qualitatively and quantitatively similar to de-alloyed $Pt_3Ni_7$ nanoparticles, but with an increase in ORR-favorable patterns, thus explaining the experimentally observed superior ORR catalytic activity for the NW. A snapshot configuration from the Reactive Molecular Dynamics runs of the Pt nanowire is provided.

TABLE 2

Geometric analysis of the final predicted structure of 46-nm-long de-alloyed Pt nanowire (snapshot from the RMD trajectory) compared with the predicted structure of a fully de-alloyed $Pt_3Ni_7$NP (initially 10 nm in diameter, finally at about 8 nm in diameter).

|  | vdW Surface Area ($m^2/g_{Pt}$) | Surface Atoms N (%) | ORR-favorable Rhombi N (%) |
|---|---|---|---|
| De-alloyed NW | 105 | 41% | 85% |
| NP (70% Ni) | 61 | 26% | 57% |

As used herein, the singular terms "a," "an," and "the" may include plural referents unless the context clearly dictates otherwise. Thus, for example, reference to an object may include multiple objects unless the context clearly dictates otherwise.

As used herein, the term "set" refers to a collection of one or more objects. Thus, for example, a set of objects can include a single object or multiple objects.

As used herein, the terms "connect," "connected," and "connection" refer to an operational coupling or linking. Connected objects can be directly coupled to one another or can be indirectly coupled to one another, such as via one or more other objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to $\pm 10\%$ of that numerical value, such as less than or equal to $\pm 5\%$, less than or equal to $\pm 4\%$, less than or equal to $\pm 3\%$, less than or equal to $\pm 2\%$, less than or equal to $\pm 1\%$, less than or equal to $\pm 0.5\%$, less than or equal to $\pm 0.1\%$, or less than or equal to $\pm 0.05\%$. For example, a first numerical value can be substantially or about the same as a second numerical value if the first numerical value is within a range of variation of less than or equal to $\pm 10\%$ of the second numerical value, such as less than or equal to $\pm 5\%$, less than or equal to $\pm 4\%$, less than or equal to $\pm 3\%$, less than or equal to $\pm 2\%$, less than or equal to $\pm 1\%$, less than or equal to $\pm 0.5\%$, less than or equal to $\pm 0.1\%$, or less than or equal to $\pm 0.05\%$.

As used herein, the term "nanostructure" refers to an object that has at least one dimension in the range of about 1 nm to about 1000 nm. A nanostructure can have any of a wide variety of shapes, and can be formed of a wide variety of materials.

Additionally, concentrations, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a range of about 1 to about 200 should be understood to include the explicitly recited limits of about 1 and about 200, but also to include individual values such as about 2, about 3, and about 4, and sub-ranges such as about 10 to about 50, about 20 to about 100, and so forth.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, operation or operations, to the objective, spirit and scope of the disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not a limitation of the disclosure.

What is claimed is:

1. A catalyst material comprising:
   a catalyst support; and
   jagged Pt nanowires affixed to the catalyst support.

2. The catalyst material of claim 1, wherein the jagged Pt nanowires have an average diameter in a range of up to 5 nm.

3. The catalyst material of claim 1, wherein the jagged Pt nanowires have an electrochemical active surface area of at least 80 $m^2/g_{Pt}$.

4. The catalyst material of claim 1, wherein the jagged Pt nanowires have a mass activity for oxygen reduction reaction at 0.9 V vs. RHE of at least 8 $A/mg_{Pt}$.

5. The catalyst material of claim 1, wherein the jagged Pt nanowires are produced by a process comprising:
   providing Pt-M' nanowires, wherein M' is at least one sacrificial metal different from Pt; and
   subjecting the Pt-M' nanowires to electrochemical de-alloying to form jagged Pt nanowires.

6. The catalyst material of claim 1, wherein the jagged Pt nanowires comprise a jagged surface containing defective sites.

7. The catalyst material of claim 1, wherein the jagged Pt nanowires comprise a jagged surface containing a plurality of atomic steps.

8. The catalyst material of claim 1, wherein the jagged Pt nanowires have an average diameter in a range of up to 10 nm.

9. The catalyst material of claim 1, wherein the jagged Pt nanowires have an electrochemical active surface area of at least 110 $m^2/g_{Pt}$.

* * * * *

UNITED STATES PATENT AND TRADEMARK OFFICE
CERTIFICATE OF CORRECTION

| | | |
|---|---|---|
| PATENT NO. | : 11,421,345 B2 | Page 1 of 1 |
| APPLICATION NO. | : 16/329084 | |
| DATED | : August 23, 2022 | |
| INVENTOR(S) | : Xiangfeng Duan, Yu Huang and Mufan Li | |

It is certified that error appears in the above-identified patent and that said Letters Patent is hereby corrected as shown below:

In the Specification

In Column 1, after Line 11, please insert the following title and paragraph:
--STATEMENT OF FEDERAL SUPPORT
This invention was made with government support under DE-SC0008055 awarded by the U.S. Department of Energy, and 1508692 awarded by the National Science Foundation. The government has certain rights in the invention.--

Signed and Sealed this
Twenty-seventh Day of December, 2022

Katherine Kelly Vidal
*Director of the United States Patent and Trademark Office*